(12) United States Patent
Kato

(10) Patent No.: US 10,116,854 B2
(45) Date of Patent: Oct. 30, 2018

(54) PHOTOELECTRIC CONVERSION APPARATUS, SWITCHING AN ELECTRIC PATH BETWEEN A CONDUCTIVE STATE AND A NON-CONDUCTIVE STATE

(71) Applicant: CANON KABUSHIKI KAISHA, Tokyo (JP)

(72) Inventor: Satoshi Kato, Kawasaki (JP)

( * ) Notice: Subject to any disclaimer, the term of this patent is extended or adjusted under 35 U.S.C. 154(b) by 0 days.

(21) Appl. No.: 15/091,708

(22) Filed: Apr. 6, 2016

(65) Prior Publication Data

US 2016/0301889 A1 Oct. 13, 2016

(30) Foreign Application Priority Data

Apr. 13, 2015 (JP) .................... 2015-081531

(51) Int. Cl.
| | | |
|---|---|---|
| *H04N 5/232* | (2006.01) | |
| *H04N 5/357* | (2011.01) | |
| *H01L 27/146* | (2006.01) | |
| *H04N 5/374* | (2011.01) | |
| *H04N 5/3745* | (2011.01) | |

(52) U.S. Cl.
CPC ... *H04N 5/23212* (2013.01); *H01L 27/14607* (2013.01); *H04N 5/3575* (2013.01); *H04N 5/3745* (2013.01); *H04N 5/37452* (2013.01)

(58) Field of Classification Search
CPC ........... H04N 5/23212; H04N 5/37452; H04N 5/3745; H04N 5/3575; H01L 27/14607
See application file for complete search history.

(56) References Cited

U.S. PATENT DOCUMENTS

| | | | |
|---|---|---|---|
| 5,962,844 A * | 10/1999 | Merrill | H04N 3/155 250/208.1 |
| 7,741,593 B2 | 6/2010 | Iwata et al. | |
| 7,817,199 B2 | 10/2010 | Yamashita et al. | |
| 8,084,729 B2 | 12/2011 | Kato et al. | |
| 8,154,639 B2 | 4/2012 | Kato et al. | |
| 8,159,582 B2 | 4/2012 | Kato et al. | |
| 8,836,837 B2 | 9/2014 | Kinugasa | |
| 9,197,833 B2 | 11/2015 | Kato | |
| 9,267,840 B2 | 2/2016 | Kato | |
| 9,270,914 B2 | 2/2016 | Kato | |
| 9,305,954 B2 | 4/2016 | Kato et al. | |

(Continued)

FOREIGN PATENT DOCUMENTS

JP   2013-030913   2/2013

*Primary Examiner* — Gevell Selby
(74) *Attorney, Agent, or Firm* — Fitzpatrick, Cella, Harper & Scinto

(57) ABSTRACT

Provided is a photoelectric conversion apparatus, including: a sensor cell unit including a photoelectric conversion unit, an amplification unit, a select switch, and a reset switch, the amplification unit including an input node and an output node; an output line; a signal processing unit; and a control unit. The output node is electrically connected to the signal processing unit via the select switch and via the output line in this order. The input node is electrically connected to the photoelectric conversion unit, and is electrically connected to the signal processing unit via the reset switch and via the output line in this order. The control unit controls the reset switch and the select switch to be both in a conductive state in a predetermined period.

11 Claims, 16 Drawing Sheets

(56) References Cited

U.S. PATENT DOCUMENTS

| | | | | |
|---|---|---|---|---|
| 2012/0147231 A1* | 6/2012 | Inoue | ................. | H04N 5/23212 348/294 |
| 2013/0026349 A1* | 1/2013 | Kinugasa | ............... | H04N 5/378 250/214 SW |
| 2015/0281617 A1* | 10/2015 | Ichimiya | ............ | H04N 5/23212 348/322 |
| 2015/0288898 A1* | 10/2015 | Yazawa | ................. | H04N 5/363 348/300 |

* cited by examiner

PHOTOELECTRIC CONVERSION APPARATUS, SWITCHING AN ELECTRIC PATH BETWEEN A CONDUCTIVE STATE AND A NON-CONDUCTIVE STATE

BACKGROUND OF THE INVENTION

Field of the Invention

The present invention relates to a photoelectric conversion apparatus, a method of driving the photoelectric conversion apparatus, a focus detection sensor, and an imaging system.

Description of the Related Art

Some imaging systems such as cameras include a focus detection sensor, such as an auto-focusing (AF) sensor. AF sensors in imaging systems are required to be capable of focusing in a diversity of scenes. Demands for the higher number of focusing points in AF sensors are therefore increasing.

A method of increasing the number of focusing points can be found in Japanese Patent Application Laid-Open No. 2013-30913, which describes a photoelectric conversion apparatus employing an area-type configuration in which linear sensors forming focusing points are arranged in a plurality of parallel lines and are connected in a column direction by common wiring. In Japanese Patent Application Laid-Open No. 2013-30913, an improvement in linearity and sensitivity uniformness is aimed by employing a non-inverting amplifier, typically, a source follower, in a readout circuit for a censor cell unit configured to output a pixel signal, and a memory cell unit configured to hold the pixel signal. The signal-to-noise ratio (S/N ratio) is also improved in Japanese Patent Application Laid-Open No. 2013-30913 by using a noise clamp circuit (transfer unit) to feedback part of noise generated in the sensor cell unit and thereby reduce the noise component of an optical signal that is output.

SUMMARY OF THE INVENTION

According to one embodiment of the present invention, there is provided a photoelectric conversion apparatus, including: a sensor cell unit including a photoelectric conversion unit, an amplification unit, a select switch, and a reset switch, the amplification unit including an input node and an output node; an output line; a signal processing unit; and a control unit. The output node is electrically connected to the signal processing unit via the select switch and via the output line in this order. An electrical path between the output node and the output line is switched between a conductive state and a non-conductive state by the select switch. The input node is electrically connected to the photoelectric conversion unit, and is electrically connected to the signal processing unit via the reset switch and via the output line in this order. An electric path between the input node and the output line is switched between a conductive state and a non-conductive state by the reset switch. The control unit is configured to control the reset switch and the select switch to be both in a conductive state in a predetermined period.

Further features of the present invention will become apparent from the following description of exemplary embodiments with reference to the attached drawings.

DESCRIPTION OF THE EMBODIMENTS

The inventor of the present invention has found out that the method of Japanese Patent Application Laid-Open No. 2013-30913 has problems described below.

Figure 4:
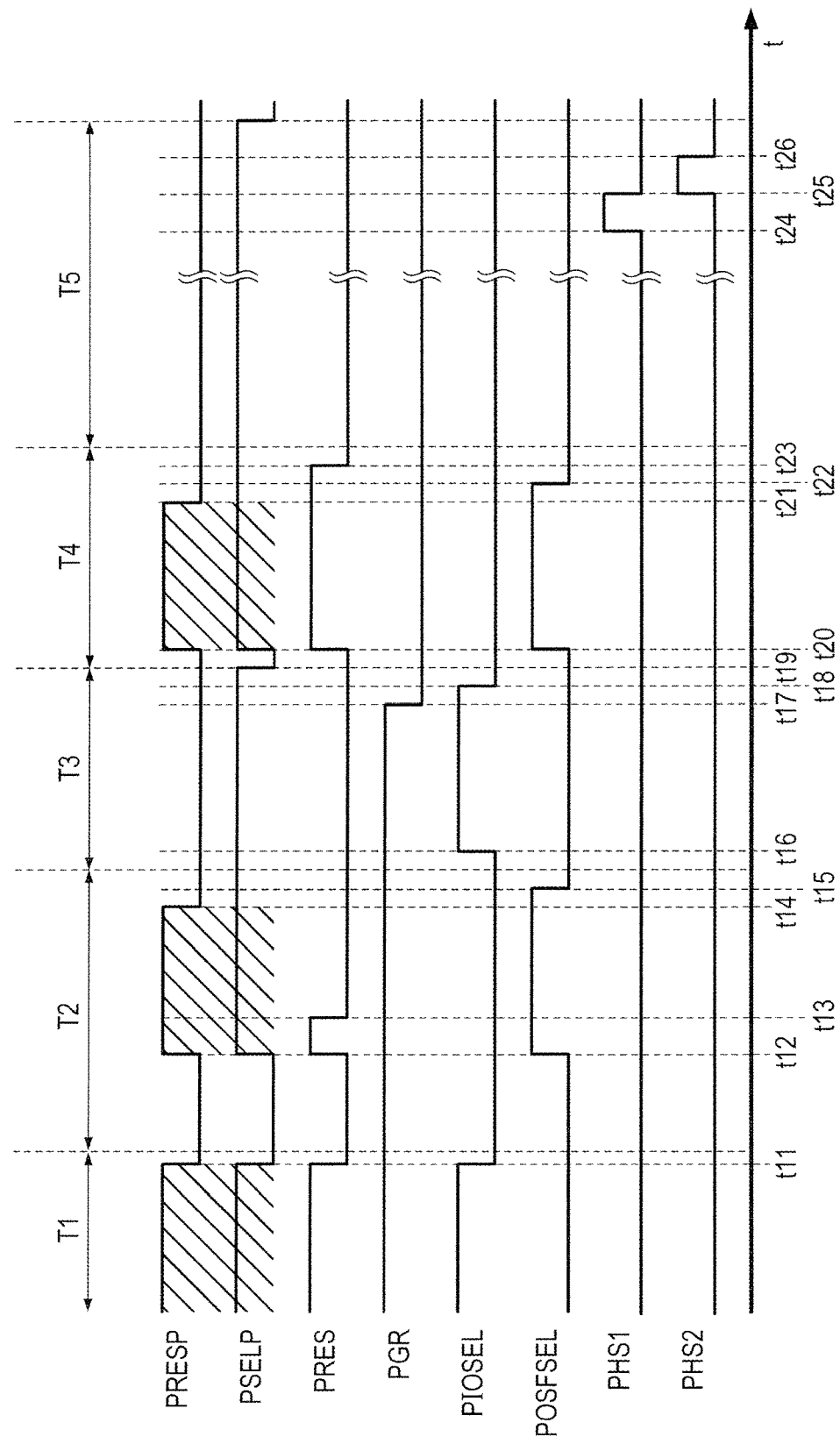
FIG. 4 is a timing chart according to the first embodiment of the present invention.

In a timing chart of FIG. 4 of Japanese Patent Application Laid-Open No. 2013-30913, noise is generated in a voltage that is read in a period T1 when a signal φSL1 shifts to the high level, and a voltage that is read in a period T4 and subsequent periods when the signal φSL1 shifts to the high level. These noises are correlated little with one another. The noises result from the fact that fluctuations in the source potential of an input transistor of the source follower amplifier (non-inverting amplifier) in the periods T1 and T4 affect the photodiode potential through capacitive coupling. The cause thereof is described in detail below.

First, the source of the input transistor of the source follower amplifier is in a floating state, i.e., at an indefinite potential prior to the period T1. The node potential therefore fluctuates easily in response to a leakage current, crosstalk with another node, or the like. The node potential is particularly unstable in the case where operation illustrated in FIG. 4 of Japanese Patent Application Laid-Open No. 2013-30913 is executed immediately after the photoelectric conversion apparatus is Powered on, or immediately after operation that may cause a large amount of current to flow in the entire circuit, such as overall reset operation of a chip. Depending on what process design is used, under what condition the photoelectric conversion apparatus is used, and other factors, the initial value of the source potential at the start of the period T1 may be an extreme potential such as the power supply potential or the GND potential.

If a signal based on the photodiode potential is to be read in this state in the period T1, the source node potential fluctuates between a start potential, which is the indefinite initial value, and a potential that is lower than the photodiode potential approximately by a threshold voltage. The fluctuations in source potential sometimes affect the photodiode potential through capacitive coupling via a parasitic capacitance between the gate and the source of the input transistor which is caused by the layout or the like. Fluctuations in photodiode potential cause the read output voltage to fluctuate as well, which can lead to noise.

In the case where the amount of this potential fluctuation is equal to the amount of potential fluctuation caused by a similar mechanism in the period T4 and subsequent periods, most of the noise component can be removed by noise clamp processing, and the S/N ratio is accordingly affected little. In actuality, however, the noise component correlation described above is low between the voltage read in the period T1 and the voltage read in the period T4 and subsequent periods because of a difference in the initial value of the source potential of the input transistor. As a result, part of noise that is not quite removed by a series of noise clamp processing procedures with the use of the transfer unit and remains in the signal component can impair the S/N ratio.

The influence of the noise which is due to capacitive coupling via the parasitic capacitance tends to be more prominent when the capacitance of the photodiode is smaller. This means that the influence of the noise can be more noticeable in the current of technology of recent years which reduces the photodiode capacity by reducing the detection capacity for further improvement of the S/N ratio.

Some of embodiments of the present invention have been made in view of the points described above, and the embodiments may improve the S/N ratio of a photoelectric conversion apparatus.

Preferred embodiments of the present invention will now be described in detail in accordance with the accompanying drawings.

(First Embodiment)

Figure 1:
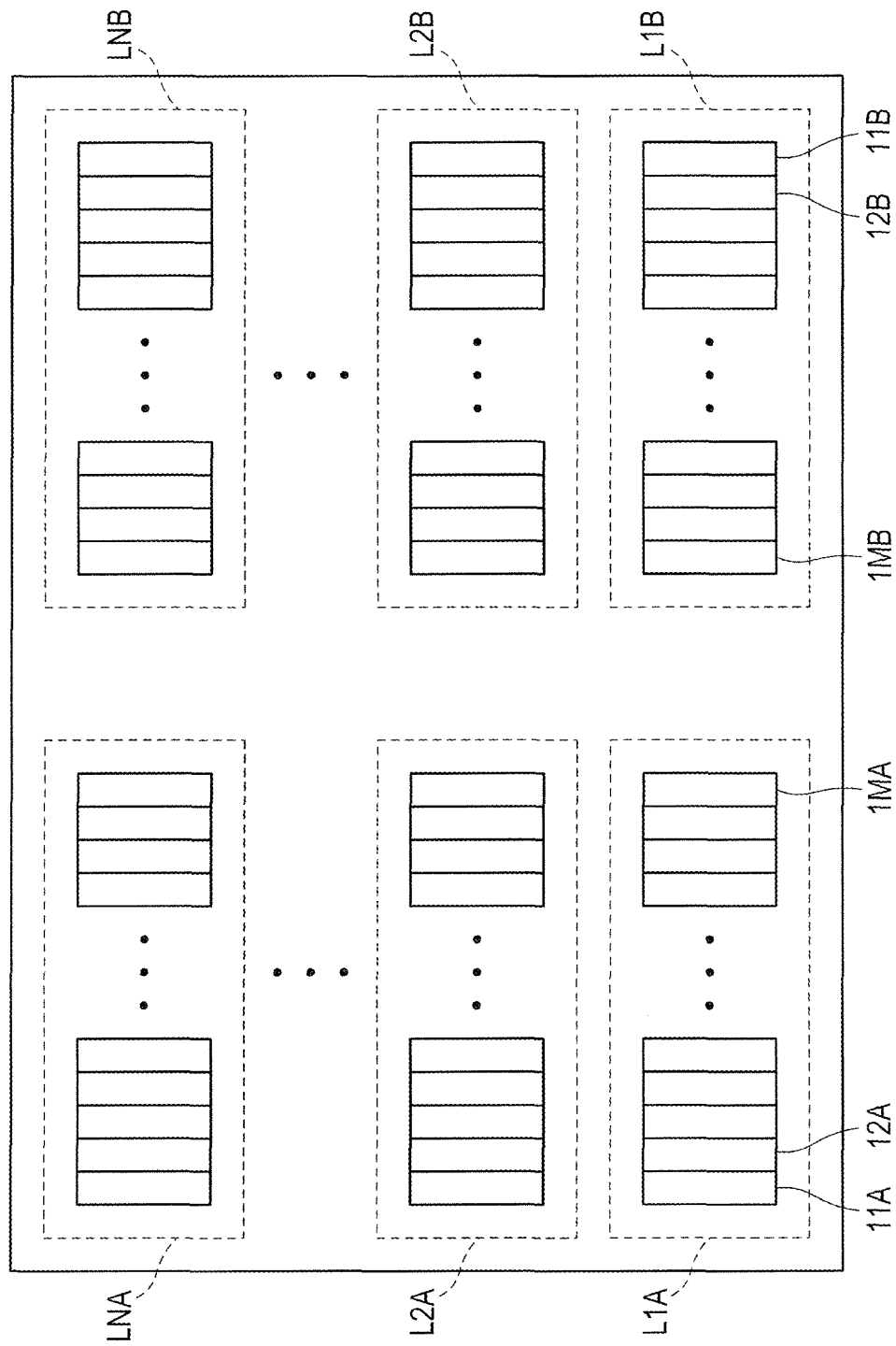
FIG. 1 is a schematic diagram for illustrating an imaging surface of a photoelectric conversion apparatus according to a first embodiment of the present invention.

A photoelectric conversion apparatus for phase difference focus detection is described as an example of a first embodiment of the present invention. FIG. 1 is a schematic diagram for illustrating an imaging surface in the photoelectric conversion apparatus for phase difference AF. The imaging surface of the photoelectric conversion apparatus of this embodiment has N rows by two columns of line sensor units arranged so that line sensor units L1A, L2A . . . LNA form one column while line sensor units L1B, L2B . . . LNB form the other column. The line sensor units L1A and L1B are paired with each other. Similarly, L2A and L2B, LNA and LNB, and all the line sensor units in-between in one column and the other column are paired with each other. A pair of line sensor units is used to measure the defocusing amount of an object at a point that corresponds to a region in which the line sensor units are arranged. Arranging a plurality of such pairs of line sensor units and thus providing a plurality of focusing points can improve the precision of AF. Each of the line sensor units L1A, L2A . . . LNA includes M lines of unit pixels 11A, 12A . . . 1MA, and each of the line sensor units L1B, L2B . . . LNB includes M lines of unit pixels 11B, 12B . . . 1MB.

Figure 2:
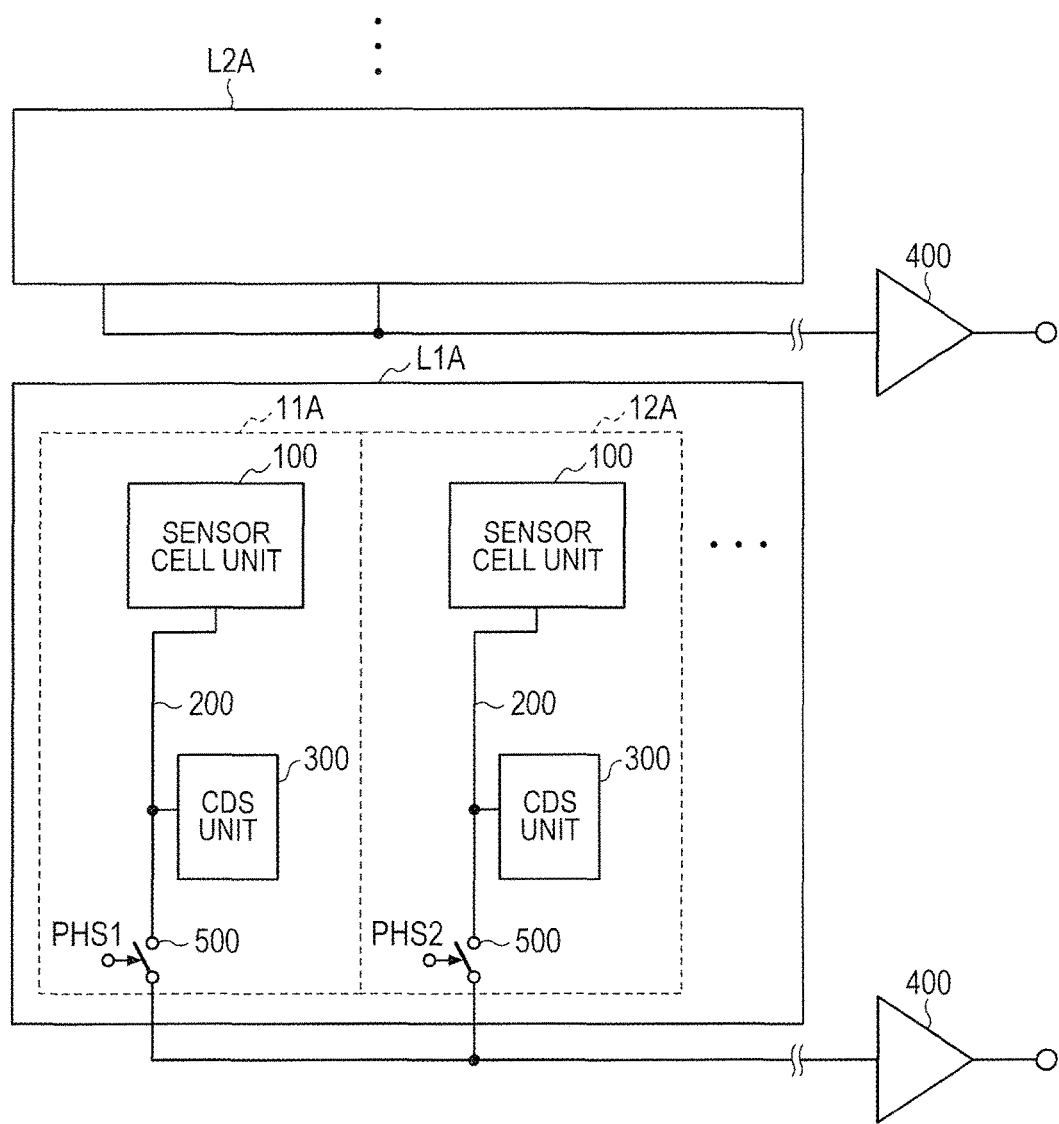
FIG. 2 is a block diagram of a line sensor unit according to the first embodiment of the present invention.

FIG. 2 is a block diagram for illustrating the configuration of the line sensor unit L1A in more detail. The line sensor units L2A to LNA and L1B to LNB have the same circuit configuration as that of the line sensor unit L1A illustrated in FIG. 2, and a description on the circuit configuration thereof is omitted. The line sensor unit L1A includes the unit pixels 11A, 12A . . . 1MA. Outputs of the unit pixels 11A, 12A . . . 1MA are input to a shared buffer amplifier 400. Each of the unit pixels 11A, 12A . . . 1MA includes a sensor cell unit 100, a vertical output line 200, and a correlated double sampling (CDS) unit 300. The sensor cell unit 100 and the CDS unit 300 in each of the unit pixels 11A, 12A . . . 1MA are electrically connected to the vertical output line 200, and are electrically connected to the buffer amplifier 400 via a scanning switch 500. The scanning switches 500 of the unit pixels 11A, 12A . . . 1MA are controlled with control signals PHS1, PHS2 . . . PHSM, respectively. Switches used in the embodiments of the present invention can be formed by MOS transistors, for example. The control signals are supplied from a control unit (not shown).

Figure 3:
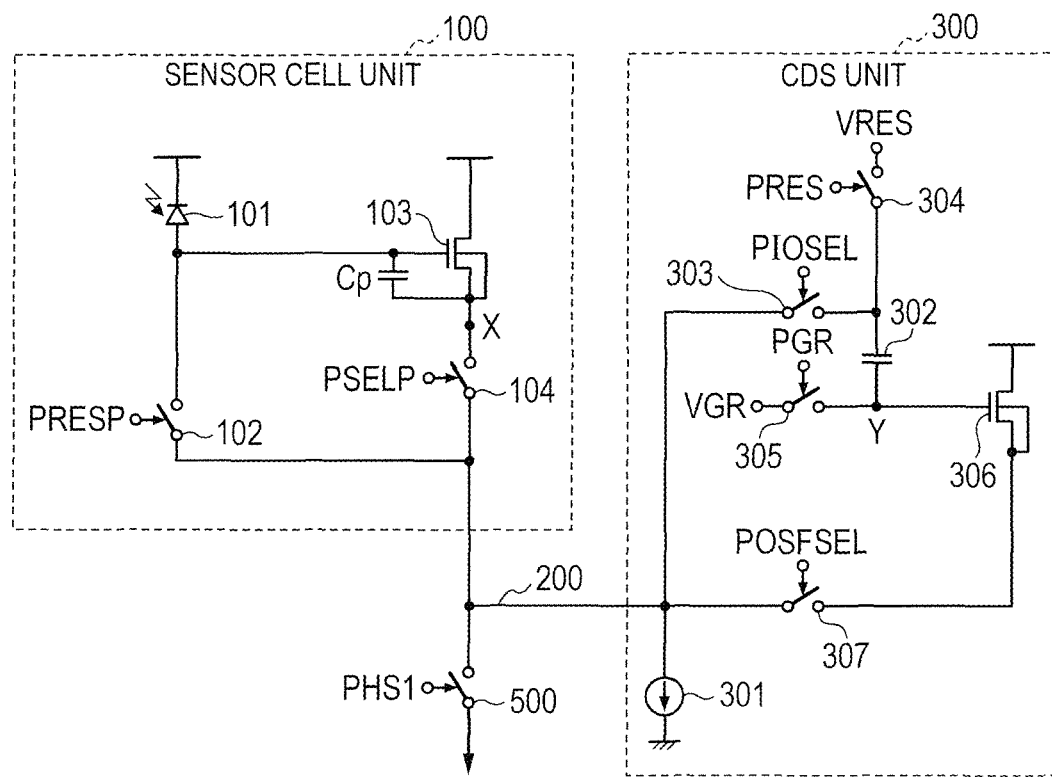
FIG. 3 is a circuit diagram of a unit pixel according to the first embodiment of the present invention.

FIG. 3 is a circuit diagram for illustrating the configuration of the unit pixel 11A. The circuit configuration of the sensor cell unit 100 is described first. The sensor cell unit 100 in the unit pixel 11A includes a photodiode (PD) 101, a reset switch 102, a transistor 103, and a select switch 104. The PD 101 is a photoelectric conversion unit configured to generate charges in an amount that is determined by the amount of incident light. The reset switch 102 is controlled with a control signal PRESP to a conductive state and a non-conductive state. The select switch 104 is controlled with a control signal PSELP to a conductive state and a non-conductive state. The transistor 103 is an amplification unit that serves as a source follower in which a voltage that is based on the charges generated in the PD 101 are input to a gate (input node) and a voltage that is determined by the input voltage is output from a source (output node). The transistor 103 in this embodiment is an N-type MOS transistor (NMOS transistor). A parasitic capacitance Cp illustrated in the sensor cell unit 100 of FIG. 3 is a parasitic capacitance generated between the gate and the source of the transistor 103.

An anode of the PD 101 is electrically connected to one terminal of the reset switch 102 and the gate of the transistor 103. A cathode of the PD 101 is electrically connected to a power supply voltage node.

The transistor 103 has a self-bias configuration in which the source node is electrically connected to a substrate node. A node at the connection point where the substrate node and source node of the transistor 103 are connected to each other is hereinafter referred to as "node X". In other words, the node X is a voltage output node of the amplification unit that is the transistor 103. A drain of the transistor 103 is electrically connected to the power supply voltage node. The node X is electrically connected to one terminal of the select switch 104. The other terminal of the reset switch 102 and the other terminal of the select switch 104 are electrically connected to the vertical output line 200.

When the select switch 104 is in a conductive state, the transistor 103 operates as a source follower along with a current source load 301 inside the CDS unit 300, which is described later. The sensor cell unit 100 outputs, via the source follower, to the vertical output line 200, an accumulated signal based on the amount of electric charge generated through photoelectric conversion in the PD 101. The signal output to the vertical output line 200 is output to the buffer amplifier 400 via the scanning switch 500. The reset switch 102 controls the operation of holding in the PD 101 the voltage of the vertical output line 200 at predetermined timing.

The circuit configuration of the CDS unit 300 is described next. The CDS unit 300 includes the current source load 301, a clamp capacitance element 302, switches 303, 304, 305, and 307, and a transistor 306. The switches 303, 304, 305, and 307 are controlled with control signals PIOSE, PRES, PGR, and POSFSEL, respectively, to a conductive state and a non-conductive state.

One terminal of the switch 304 is electrically connected to a node to which a reset voltage VRES is supplied. The other terminal of the switch 304 is electrically connected to one terminal of the switch 303 and one terminal of the clamp capacitance element 302. The other terminal of the switch 303 is electrically connected to the vertical output line 200. The other terminal of the clamp capacitance element 302 is electrically connected to one terminal of the switch 305 and a gate of the transistor 306. A node at the connection point where the clamp capacitance element 302 is connected to the switch 305 and to the transistor 306 is hereinafter referred to as "node Y."The other terminal of the switch 305 is electrically connected to a node to which a clamp voltage VGR is supplied. The clamp capacitance element 302 has a function of holding the voltage of the vertical output line 200 depending on whether the switches 303, 304, 305, and 307 are in a conductive state or a non-conductive state, and a function of outputting, to the vertical output line 200, a voltage based on the held voltage. In other words, the CDS unit 300 functions as a signal processing unit configured to hold and output the voltage of the vertical output line 200.

Similarly to the transistor 103, the transistor 306 has a self-bias configuration in which a substrate node and a source node are electrically connected to each other. A drain of the transistor 306 is electrically connected to a power supply voltage node. The source of the transistor 306 is electrically connected to one terminal of the switch 307. The other terminal of the switch 307 is electrically connected to the vertical output line 200. The current source load 301 configured to supply a current to the source follower of the sensor cell unit 100 and to a source follower of the CDS unit 300 is electrically connected to the vertical output line 200. When the switch 307 is in a conductive state, the transistor 306 and the current source load 301 operate as a source follower circuit.

FIG. 4 is a timing chart for illustrating operation timing of the circuit of FIG. 2 and FIG. 3. The description given below with reference to FIG. 2, FIG. 3, and FIG. 4 is about the operation of the photoelectric conversion apparatus according to this embodiment. The switches illustrated in FIG. 2 and FIG. 3 are in a conductive state when signals for controlling the switches are at the high level in the timing chart of FIG. 4, and are in a non-conductive state when the control signals are at the low level in FIG. 4. Hatched parts in the timing chart represent periods in which the control signals PRESP and PSELP are both at the high level.

A period T1 is an initialization period in which the sensor cell unit 100 and the CDS unit 300 are initialized. The control signals PRESP, PSELP, PRES, PGR, and PIOSEL are set to the high level prior to a time t11. This resets the nodes in the sensor cell unit 100 with the reset voltage VRES, and resets the node Y with the clamp voltage VGR. At this point, where the control signal PSELP is at the high level, the reset voltage VRES is applied to the node X. The control signals PRESP and PSELP are both at the high level prior to the time t11. In other words, the reset switch 102 and the select switch 104 are both in a conductive state.

At the time t11, the control signals PRESP, PSELP, PRES, and PIOSEL shift to the low level, thereby completing the initialization of the sensor cell unit 100 and the CDS unit 300.

In a period T2, the PD 101 holds a reference voltage. At a time t12, the control signals PRESP, PSELP, PRES, and POSFSEL shift to the high level. This inputs to the PD 101 a reference voltage based on the clamp voltage VGR, which is output from the source follower inside the CDS unit 300. The reference voltages held in the PD 101 at this point is approximately (VGR−VTHN) when the threshold voltage of the NMOS transistor forming the transistor 306 is given as VTHN. At subsequent times t13, t14, and t15, the control signals PRES, PRESP, and POSESEL shift to the low level, respectively. This causes the PD 101 to end the holding of the reference voltage.

More strictly speaking, not only the threshold voltage VTHN but also a voltage based on an overdrive voltage of the transistor 306 affects the difference in the input/output voltage of the source follower. However, the threshold voltage VTHN alone is considered and the influence of the other components is ignored here in order to simplify the description.

In a period from the time t12 to the time t14 where the reference voltage is input to the PD 101, the control signals PRESP and PSELP are both at the high level. In other words, the reset switch 102 and the select switch 104 are both in a conductive state in the period from the time t12 to the time t14 (a first period). This short-circuits the gate and the source of the transistor 103, thereby setting a gate-source voltage VGS to 0. The source follower inside the sensor cell unit 100 which includes the transistor 103 as an input transistor therefore does not operate as an amplifier. Accordingly, the source follower inside the sensor cell unit 100 does not affect the output voltage of the source follower inside the CDS unit 300 which appears in the vertical output line 200.

After the times t14 and t15 at which the control signals PRESP and POSFSEL shift to the low level, the source follower inside the sensor cell unit 100 is enabled. This gives the node X a voltage that is lower than the reference voltage (VGR−VTHN) by another VTHN, namely, a voltage (VGR−2×VTHN), which is output to the vertical output line 200. In short, the amount of voltage fluctuation before and after the source follower inside the sensor cell unit 100 starts outputting a signal approximately (−VTHN).

At this point, the potential of the PD 101 changes by $(-\Delta VN1=(-VTHN \times Cp/(Cpd+Cp)))$ due to capacitive coupling that involves the parasitic capacitance Cp, which is generated between the gate and the source of the transistor 103, and a PD capacitance Cpd of the PD 101. The potential of the PD 101 is consequently (VGR−VTHN−ΔVN1), and the voltage of the vertical output line 200 is (VGR−2×VTHN−ΔVN1). This voltage indicates the level of noise generated in the sensor cell unit 100.

In a period T3 (a second period), the noise level output from the source follower inside the sensor cell unit 100 is sampled. At a time t16, the control signal PIOSEL shifts to the high level. The shift triggers the sampling of the voltage (VGR−2×VTHN−ΔVN1) of the vertical output line 200 in the clamp capacitance element 302, with the clamp voltage VGR as a reference. At subsequent times t17, t18, and t19, the control signals PGR, PIOSEL, and PSELP shift to the low level, respectively, thereby completing the sampling of the noise level. The noise of which the level is sampled in the sampling described above includes threshold voltage fluctuations of the transistors 103 and 306, the switching noise of the reset switch 102, the switching noise of the switches 303 and 305, and random noise such as heat noise generated by the elements. However, these are omitted from the description for the sake of simplification.

In a period 14, the PD 101 holds the noise level voltage. At a time t20, the control signals PRESP, PSELP, PRES, and POSFSEL shift to the high level. This gives the node Y in the CDS unit 300 a voltage (VRES+2×VTHN+ΔVN1) in conformity to the law of conservation of charge. The output voltage of the source follower inside the CDS unit 300 is (VRES+VTHN+ΔVN1). This output voltage is input to the PD 101 again to be held therein. In a period from the time t20 to a time 21 (a third period), the control signals PRESP and PSELP are both at the high level, which controls the reset switch 102 and the select switch 104 to be both in a conductive state, as in a part of the period 12 from the time t12 to the time t14.

The control signals PRESP and POSFSEL then shift to the low level at the time t21 and a time t22, respectively. In a subsequent period T5, the accumulation of light in the PD 101 is started. The source follower inside the sensor cell unit 100 is enabled at the same time. This changes the potential of the node X by (−VTHN) as in the period T2, and capacitance coupling due to the parasitic capacitance Cp causes the potential of the PD 101 to change by (−ΔVN2). The potential of the PD 101 at the start of light accumulation is accordingly (VRES+VTHN+ΔVN1−ΔVN2). The symbols ΔVN1 and ΔVN2 both represent noise generated through capacitive coupling due to the parasitic capacitance Cp. The amount of voltage fluctuation of the parasitic capacitance Cp which is the cause of the noise is the same at (−VTHN). The noises ΔVN1 and ΔVN2 therefore ideally equal to each other (ΔVN1=ΔVN2). The potential of the PD 101 at the start of light accumulation is accordingly (VRES+VTHN).

At a time t24 where a predetermined length of accumulation time has passed since the start of the period T5, the control signal PHS1 shifts to the high level. At a time t25, the control signal PHS1 next shifts to the low level, and the control signal PHS2 shifts to the high level. At a time t26, the control signal PHS2 shifts to the low level and a control signal PHS3 shifts to the high level. In this manner, the control signals PHS1, PHS2 sequentially shift to the high level, and signals based on the amount of light are output to the outside of the sensor from the unit pixels 11A, 12A . . . 1MA in order.

The voltage amplitude of an optical signal based on photocharges that are generated in the PD 101 at the time the optical signals are output from the respective unit pixels is given as VL, and the potential of the PD 101 is then expressed as (VL+VRES+VTHN). A potential (VL+VRES), which is lower than the potential of the PD 101 by the threshold voltage VTHN, is accordingly output to the vertical output line 200. In other words, a signal that is determined only by the reset voltage VRES and the voltage amplitude VL of the optical signal is output.

As described above, electrical connection is established in the select switch 104 as well as in the reset switch 102 when the PD 101 is to hold the reference voltage or the noise level voltage in this embodiment. In other words, the reset switch 102 and the select switch 104 are both in a conductive state for a predetermined period of time (in this embodiment, the period T1, a part of the period T2, and a part of the period T4). The amount of source voltage fluctuation of the transistor 103, which serves as the source follower inside the sensor cell unit 100, can thus be fixed to an amount equivalent to the threshold voltage VTHN. The potential fluctuations through capacitive coupling due to the parasitic capacitance Cp are accordingly stabilized. In other words, the influence of noise is reduced by enhancing the correlation between noises that are caused in two signals used for CDS processing by capacitive coupling due to the parasitic capacitance Cp, and the S/N ratio can be improved as a result. It is therefore concluded that the precision of focus detection can be improved by using the photoelectric conversion apparatus of this embodiment as a focus detection sensor (an AF sensor).

It is preferred to set the clamp voltage VGR and the reset voltage VRES so that the potential held in the PD 101 in the period T2 and the potential held in the PD 101 in the period T4 are as close to each other as possible. It is more preferred that the potential held in the PD 101 in the period T2 and the potential held in the PD 101 in the period T4 be made equal to each other. The potential held in the PD 101 in the period T2 and the potential held in the PD 101 in the period T4 can be made equal to each other by setting VGR to (VRES+2×VTHN) in the case where the former potential is (VGR−VTHN) and the latter potential is (VRES+VTHN) as described above.

While the reset switch 102 and the select switch 104 are both controlled in a conductive state in the period T1 and parts of the periods T2 and T4 in this embodiment, it is not always necessary to execute this control in all of these periods. For example, the photoelectric conversion apparatus may be configured so that the reset switch 102 and the select switch 104 are both in a conductive state in one or two periods out of these periods. The potential fluctuations through capacitive coupling due to the parasitic capacitance Cp can be stabilized also in this case, and the noise caused by the potential fluctuations can accordingly be reduced.

The first embodiment described above is merely an example of the photoelectric conversion apparatus to which the present invention can be applied. In other words, the present invention is not limited thereto and various modifications can be made. Examples of the modifications are described below.

(First Modification Example)

In the circuit configuration of FIG. 3, the electrical connection between the vertical output line 200 and the current source load 301 is a direct connection that uses wiring. The vertical output line 200 and the current source load 301 may instead be electrically connected to each other via a switch. This switch is configured so as to be switched on when the select switch 104 or the switch 307 is switched on. Specifically, a control signal of the switch connected in an electrical path between the vertical output line 200 and the current source load 301 is the logical sum of the control signals PSELP and POSFSEL.

This can prevent the current source load 301 from lowering the voltage of the vertical output line 200 in a period where the source of the transistor 103 and the source of the transistor 306 are both non-conductive with respect to the current source load 301 (for example, a period from the time t11 to the time t12).

(Second Modification Example)

Periods in which the control signals PRESP and PSELP are both at the high level are not limited to the ones illustrated in FIG. 4. In the timing chart of FIG. 4, the control signals PRESP and PSELP are both at the high level in the period prior to the time t11, the period from the time t12 to the time t14, and the period from the time t20 to the time t21. In timing charts of FIG. 5 and FIG. 6 according to a modification example of the embodiment, periods in which the control signal PSELP is at the high level are shorter than in FIG. 4.

Figure 5:
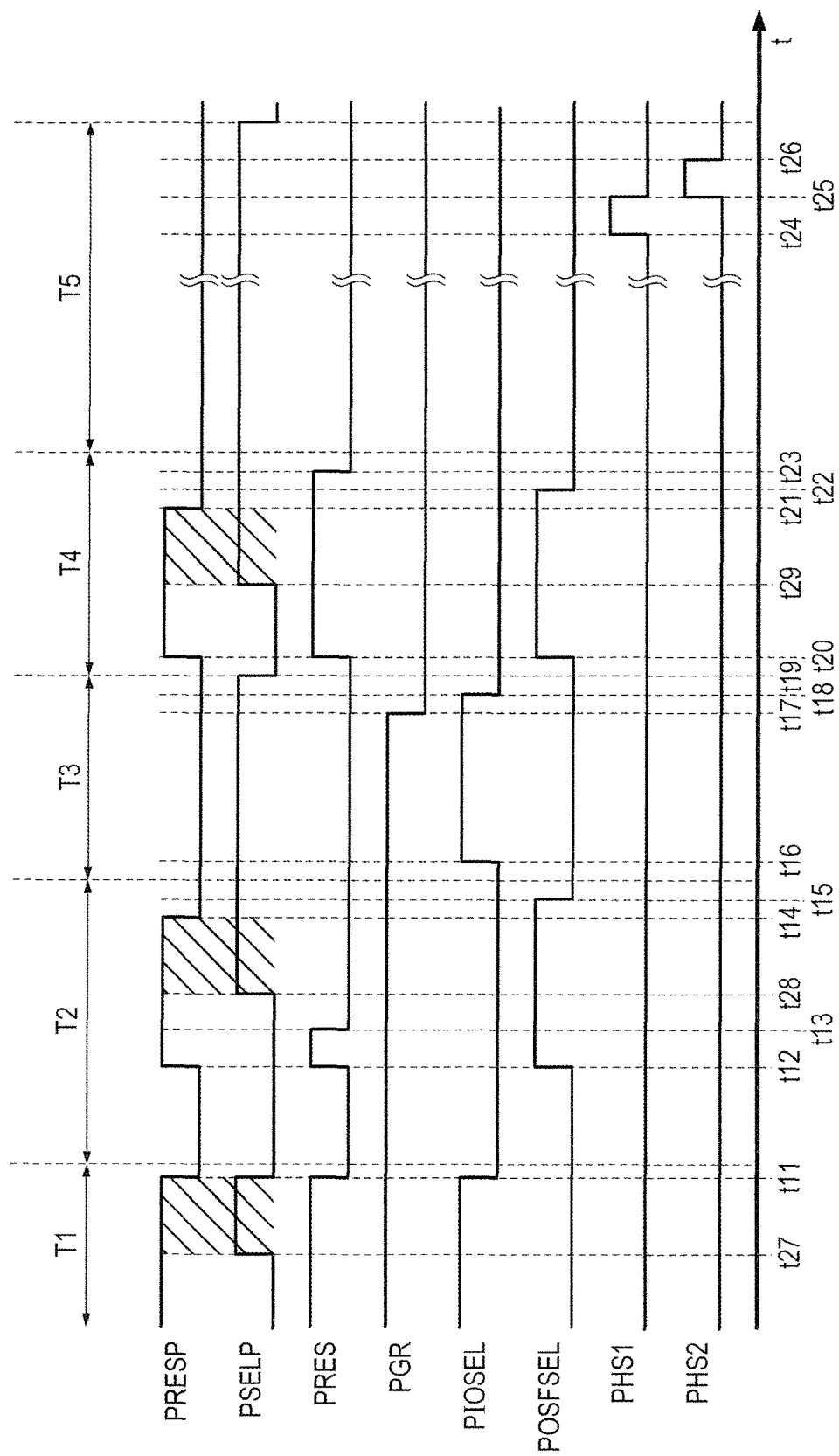
FIG. 5 is a timing chart according to a second modification example of the first embodiment of the present invention.

In the timing chart of FIG. 5, the operation timing of the control signal PSELP is set so that the control signal PSELP is at the high level on the falling side of the control signal PRESP. Specifically, the control signals PRESP and PSELP are both at the high level in a period from a time t27 to the time t11, a period from a time t28 to the time t14, and a period from a time t29 to the time t21 in the timing chart of FIG. 5.

Figure 6:
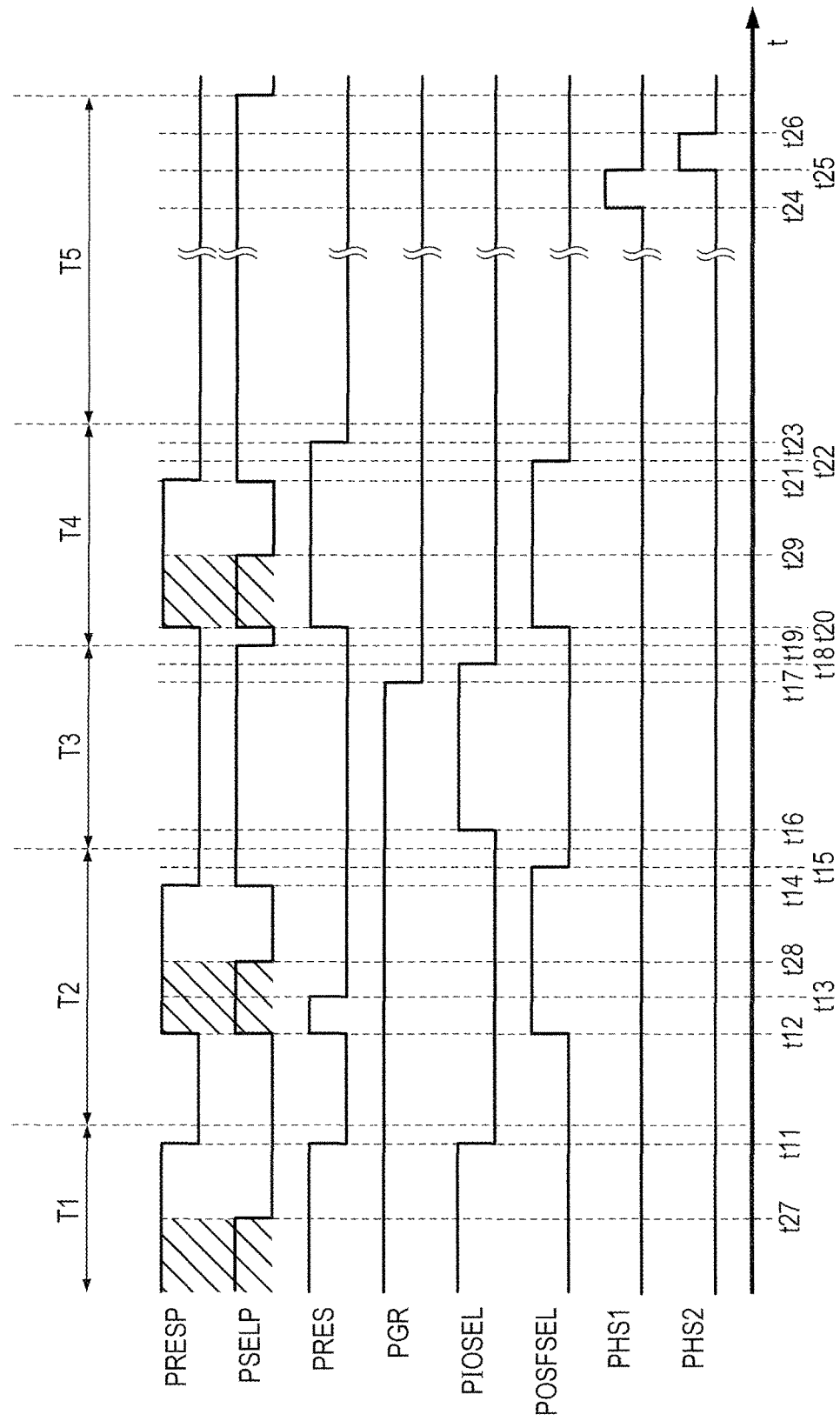
FIG. 6 is a timing chart according to the second modification example of the first embodiment of the present invention.

In the timing chart of FIG. 6, the operation timing of the control signal PSELP is set so that the control signal PSELP is at the high level on the rising side of the control signal PRESP. Specifically, the control signals PRESP and PSELP are both at the high level in a period prior to the time t27, a period from the time t12 to the time t28, and a period from the time t20 to the time t29 in the timing chart of FIG. 6.

Effects of this embodiment can be obtained by switching on both the reset switch 102 and the select switch 104 so that node X has a predetermined potential. It is not always necessary to set the control signals PRESP and PSELP both to the high level in all of the period prior to the time t11, the period from the time t12 to the time t14, and the period from the time t20 to the time t21 in the timing chart of FIG. 4. The same effects are therefore obtained also when the control signals PRESP and PSELP are both set to the high level in only some of these periods as in FIG. 5 and FIG. 6.

A range between several nanoseconds and several tens microseconds, for example, is preferred as the length of a period in which the control signals PRESP and PSELP are both set to the high level. This way, not only the effects of this embodiment are obtained but also an operation time requirement demanded of a photoelectric conversion apparatus for phase difference focus detection can be fulfilled.

(Third Modification Example)

Figure 7:
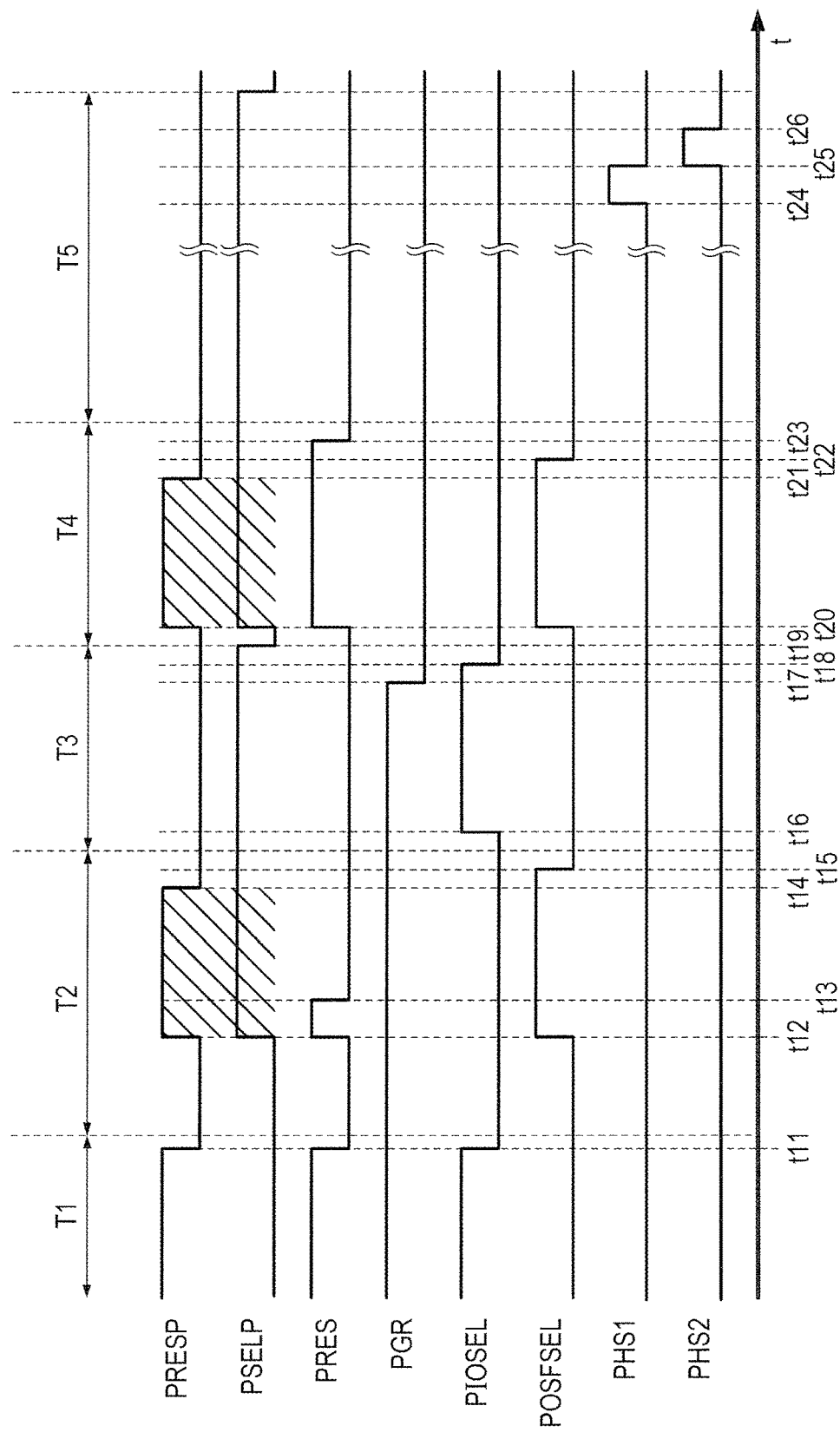
FIG. 7 is a timing chart according to a third modification example of the first embodiment of the present invention.

It is not always necessary to set the control signals PSELP and PRESP both to the high level in the period T1 where the sensor cell unit 100 and the CDS unit 300 are initialized. The initialization in the period T1 is for setting the potential of each node in the circuit for quick and efficient operation in the period 12 and subsequent periods. In short, the operation that has an influence over an actually obtained signal voltage is the operation in the period T2 and subsequent periods. This means that the initialization operation of the period T1 is unnecessary under some operation conditions in which a time long enough for respective nodes to converge to predetermined voltages can be secured in the time period T2. The same effects are obtained in such cases as well. FIG. 7 is an example of a timing chart in which the initialization operation of the period T1 is not executed for this reason. In FIG. 7, the control signal PSELP remains at the low level during the period T1, and the operation of setting the control signals PRESP and PSELP both to the high level in the period T1 is omitted.

(Fourth Modification Example)

Figure 8:
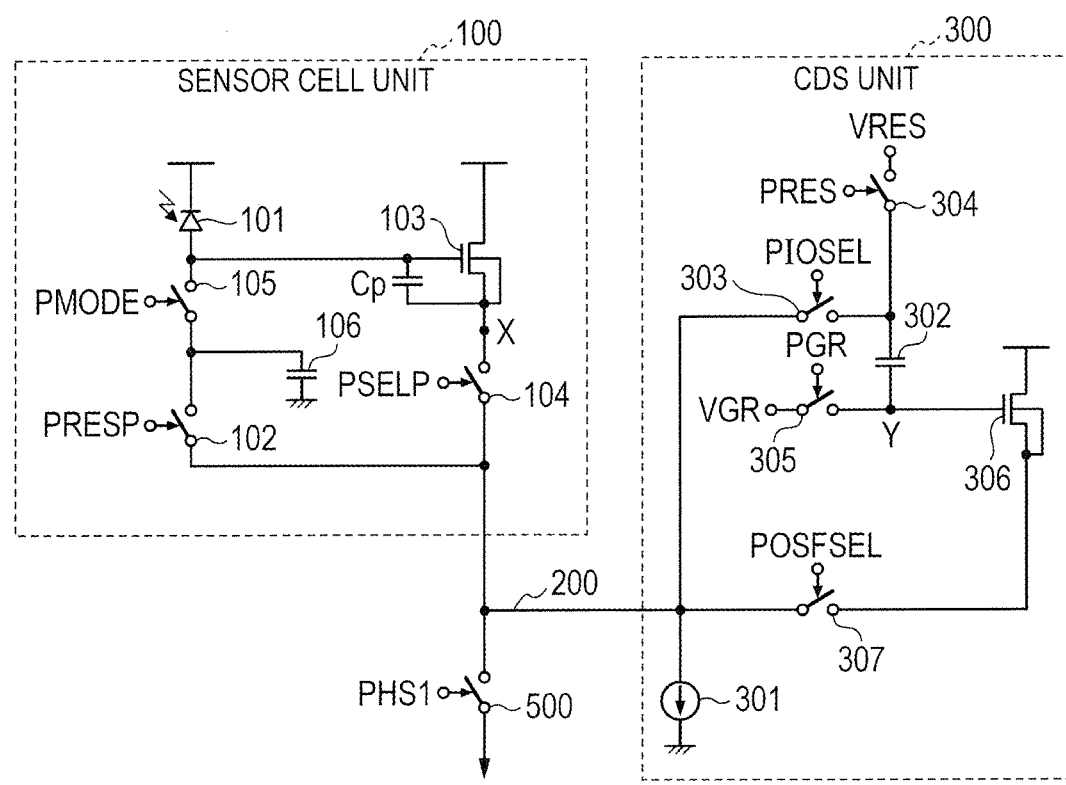
FIG. 8 is a circuit diagram of a unit pixel according to a fourth modification example of the first embodiment of the present invention.

FIG. 8 is a circuit diagram for illustrating the configuration of the unit pixel 11A according to a fourth modification example of the present invention. A switch 105 and a sensitivity switching capacitance element 106 are added to the sensor cell unit 100 of this modification example as a sensitivity switching unit. The switch 105 is connected in an electrical path between a node that electrically connects the anode of the PD 101 to the gate of the transistor 103 and the one terminal of the reset switch 102. One terminal of the sensitivity switching capacitance element 106 is electrically connected to a node that electrically connects the switch 105 to the reset switch 102. The other terminal of the sensitivity switching capacitance element 106 is grounded. The switch 105 is controlled with a control signal PMODE so as to be in a conductive state and a non-conductive state. Setting the switch 105 to a conductive state adds the capacitance of the sensitivity switching capacitance element 106 to the capacitance of the PD 101, thereby increasing the detection capacity. This can decrease the detection sensitivity (the ratio of the amount of change in output voltage to the amount of light incident on the PD 101). The present invention is thus applicable also to a photoelectric conversion apparatus that is configured to have a sensitivity switching function.

Figure 9:
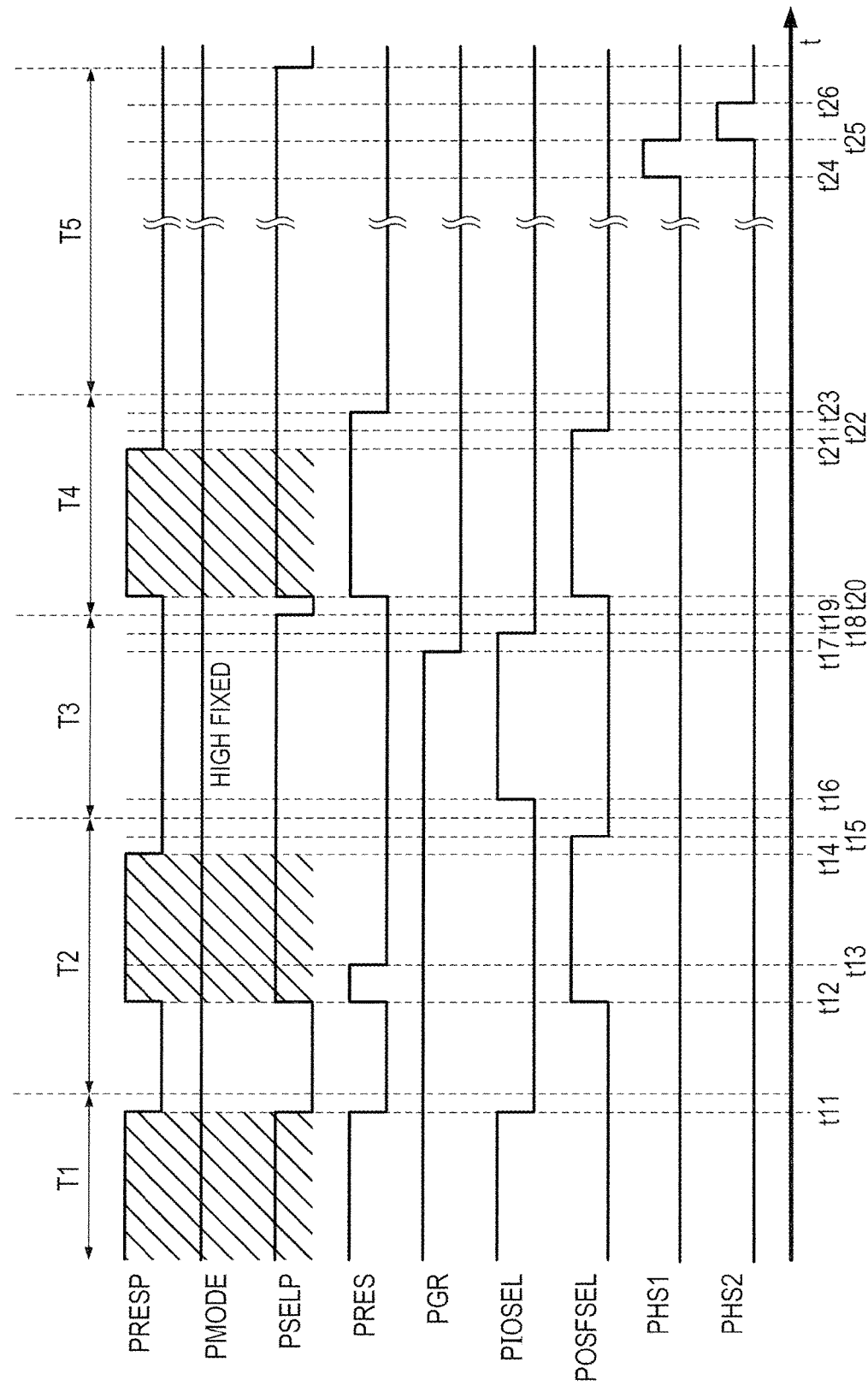
FIG. 9 is a timing chart according to the fourth modification example of the first embodiment of the present invention.
Figure 10:
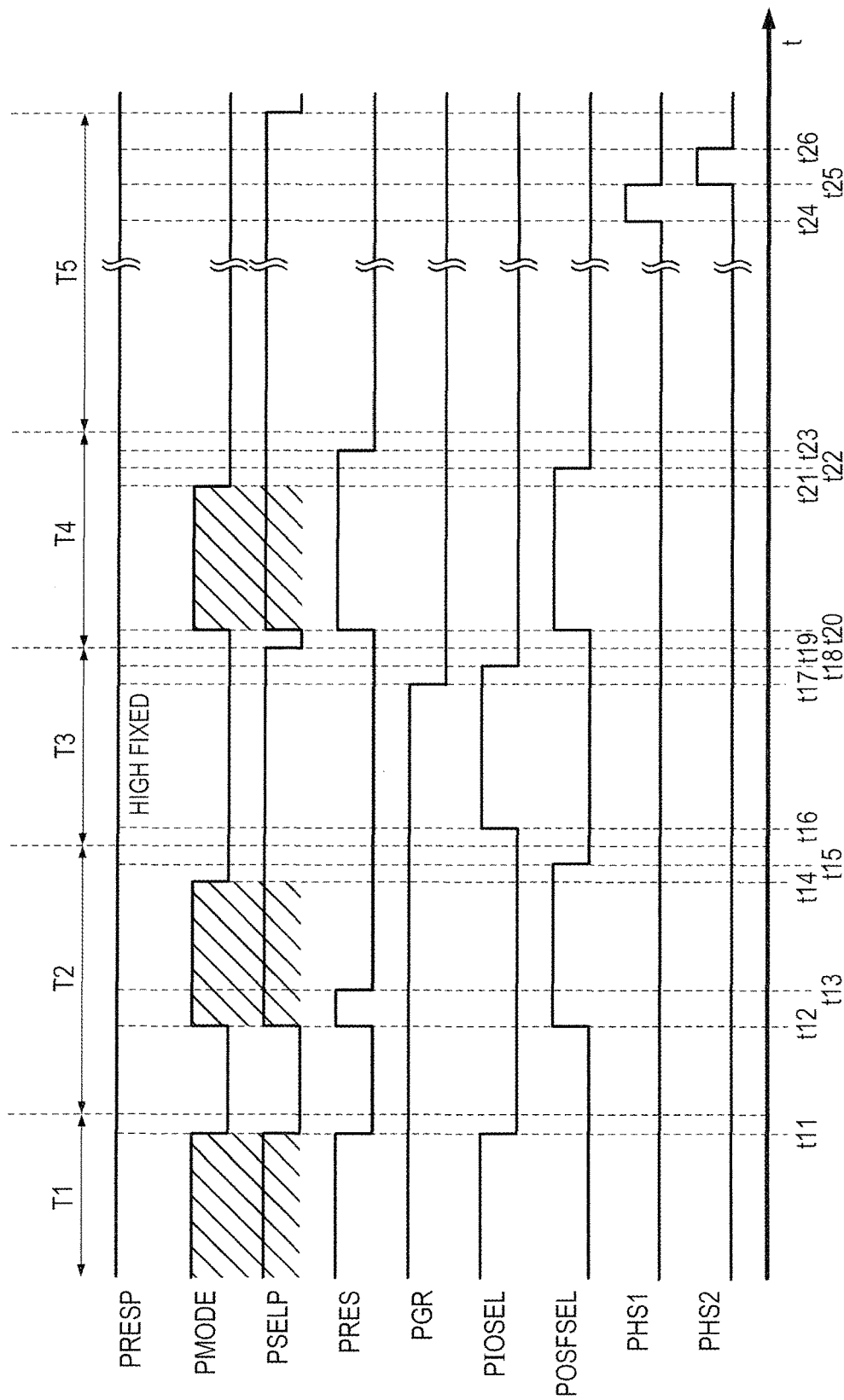
FIG. 10 is a timing chart according to the fourth modification example of the first embodiment of the present invention.

FIG. 9 and FIG. 10 are timing charts for illustrating the operation timing in the fourth modification example. FIG. 9 is a timing chart for illustrating the operation in a low sensitivity mode, and FIG. 10 is a timing chart for illustrating the operation in a high sensitivity mode.

In the low sensitivity mode of FIG. 9, the control signal PMODE is fixed to the high level. The operation of the other control signals is the same as in FIG. 4. The detection capacity is increased and the detection sensitivity is decreased in this manner.

In the high sensitivity mode of FIG. 10, the control signal PRESP is fixed to the high level, and the control signal PMODE changes at the same timing that the control signal PRESP does in FIG. 4. This makes the detection capacity smaller than the one in the low sensitivity mode described above, and makes the detection sensitivity accordingly high.

As described above, according to this modification example, the detection sensitivity can be switched by changing the operation timing.

(Fifth Modification Example)

The CDS unit 300 is not limited to the configuration illustrated in FIG. 3, and can have a suitably different circuit configuration as long as the employed configuration is not a departure from the technical concept of the present invention. For example, the source follower inside the CDS unit 300 may be changed to a voltage follower that uses an operational amplifier. The clamp circuit that includes the switches 303 and 305, the clamp capacitance element 302, and others may also be changed to a switched capacitor amplifier that includes a capacitor, an operational amplifier, and others.

(Second Embodiment)

A second embodiment of the present invention is a photoelectric conversion apparatus in which the present invention is applied to a transfer-type pixel configured to transfer photocharges that are generated in a photodiode to a floating diffusion (FD) node. The configuration of this embodiment is described with reference to FIG. 11 and FIG. 12. Descriptions on components that overlap with those in the first embodiment are omitted or simplified.

Figure 11:
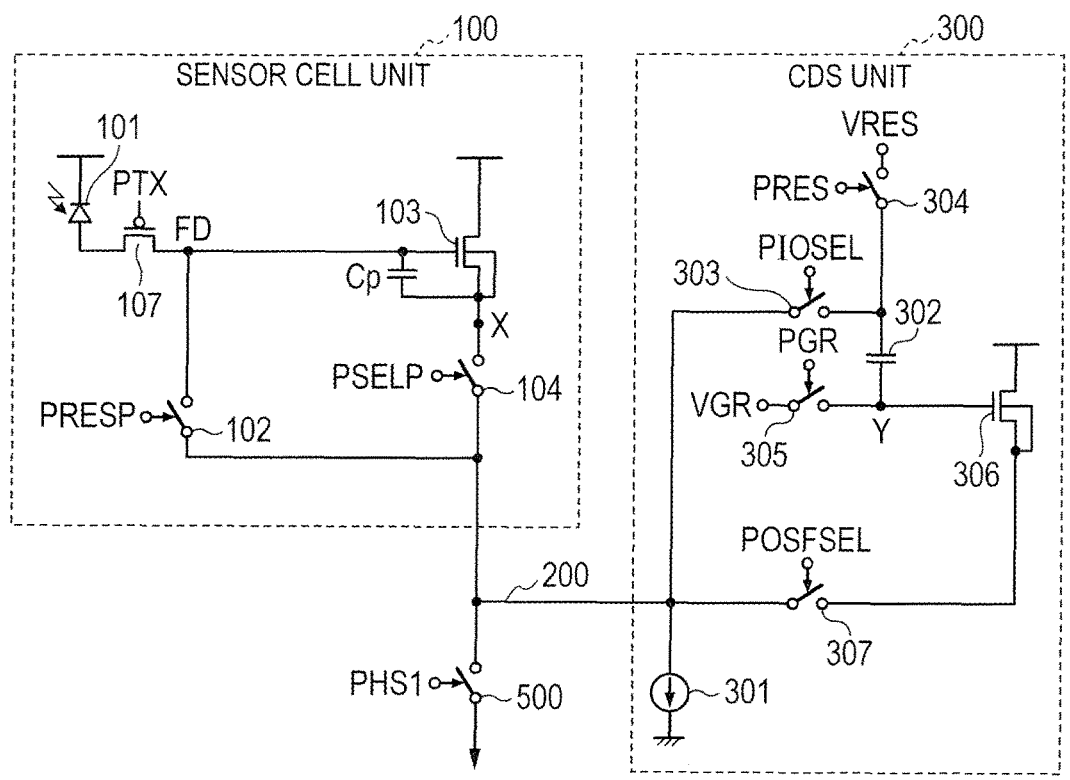
FIG. 11 is a circuit diagram of a unit pixel according to a second embodiment of the present invention.

FIG. 11 is a circuit diagram of the unit pixel 11A according to the second embodiment. The sensor cell unit 100 in FIG. 11 includes a transfer transistor 107 (a transfer switch) in addition to the sensor cell unit components of the first embodiment illustrated in FIG. 3. The transfer transistor 107 is a PMOS transistor, and is controlled with a control signal PTX to a conductive state and a non-conductive state. A source of the transfer transistor 107 is electrically connected to the anode of the PD 101. A drain of the transfer transistor 107 is electrically connected to a node FD that electrically connects the one terminal of the reset switch 102 to the gate of the transistor 103. Setting the control signal PTX to the low level controls the transfer transistor 107 to be in a conductive state, which causes the transfer transistor 107 to transfer photocharges generated in the PD 101 to the node FD.

Figure 12:
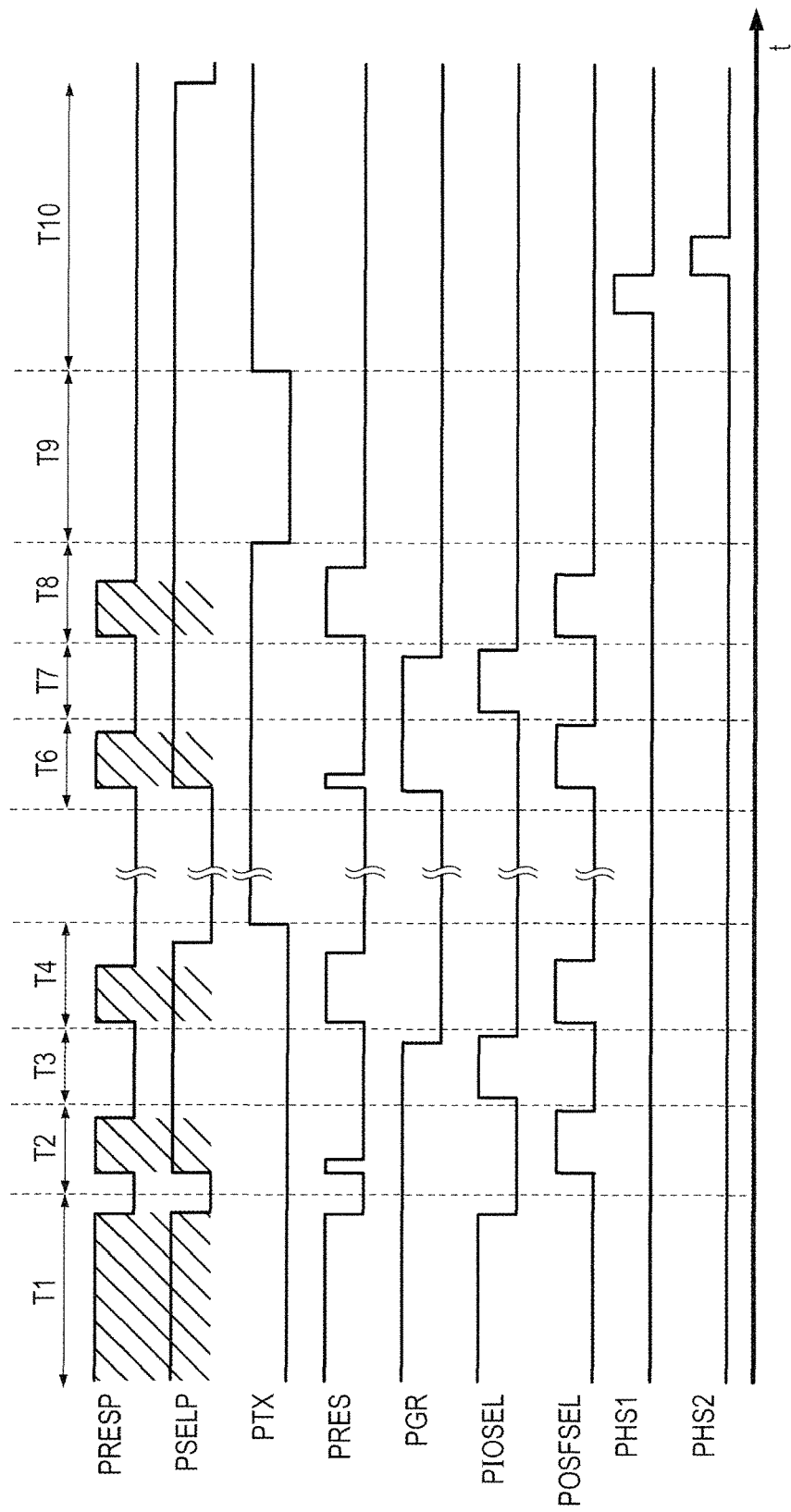
FIG. 12 is a timing chart according to the second embodiment of the present invention.

FIG. 12 is a timing chart for illustrating the operation timing of the unit pixel 11A of FIG. 11. The transfer transistor 107, which is a PMOS transistor as described above, is in a conductive state (transfer state) when the control signal PTX is at the low level. The other control signals are the same as in the first embodiment, and put their associated switches in a conductive state when set to the high level.

In the periods T1, T2, T3, and T4, the control signal PTX is at the low level and the transfer transistor 107 is in a conductive state. The operation timing of the other control signals in these periods is substantially the same as in the periods T1, T2, T3, and T4 in FIG. 4. The periods T1, T2, T3, and T4 are accordingly reset operation periods of the PD 101. After the period T4 is ended, the control signal PTX shifts to the high level and the transfer transistor 107 is controlled to be in a non-conductive state, thereby starting the accumulation of light.

The potential of the PD 101 and the potential of the node FD at the end of the period T4 are affected less by the capacitive coupling that is due to the parasitic capacitance Cp for the same reason as the one described in the first embodiment.

In periods T6, T7, and T8, which arrive after a predetermined length of accumulation time elapses, pre-transfer reset operation of the node FD is executed. The control signal PTX is at the high level and the transfer transistor 107 is in a non-conductive state in the periods T6, T7, and T8. The operation timing of the other control signals is substantially the same as in the periods T2, T3, and T4. The potential of the node FD at the end of the period T8 is therefore at the voltage level (VRES+VTHN) described in the first embodiment, and the influence of the capacitive coupling due to the parasitic capacitance Cp is reduced.

In a period T9, the control signal PTX shifts to the low level, and charges are transferred from the PD 101 to the node FD. The voltage amplitude VL of an optical signal generated by this charge transfer has a value that is determined by the capacitance value of the node FD and the amount of photocharge transferred. When the transfer operation in the period T9 is ended, the control signal PTX returns to the high level. The potential of the node FD at this point is (VL+VRES+VTHN), which is the sum of the pre-transfer potential of the node FD and the voltage amplitude VL of the optical signal.

In a subsequent period T10, signals based on the amount of light are output sequentially to the outside of the sensor by operation similar to the one in the period T5 of the first embodiment which is illustrated in FIG. 4.

As described above, the present invention is applicable also to a configuration that uses a transfer-type pixel, and the same effects as those of the first embodiment can be obtained. In addition, the transfer-type pixel of this embodiment produces less noise than in a method that reads photocharges directly as in the first embodiment, and the influence of noise is accordingly reduced even more.

(Third Embodiment)

A third embodiment of the present invention is an example of applying the present invention to a photoelectric conversion apparatus in which a memory cell unit 110 is added to the inside of each unit pixel to serve as a frame memory. The configuration of this embodiment is described with reference to FIG. 13, FIG. 14, and FIG. 15. Descriptions on components that overlap with those in the first embodiment or the second embodiment are omitted or simplified.

Figure 13:
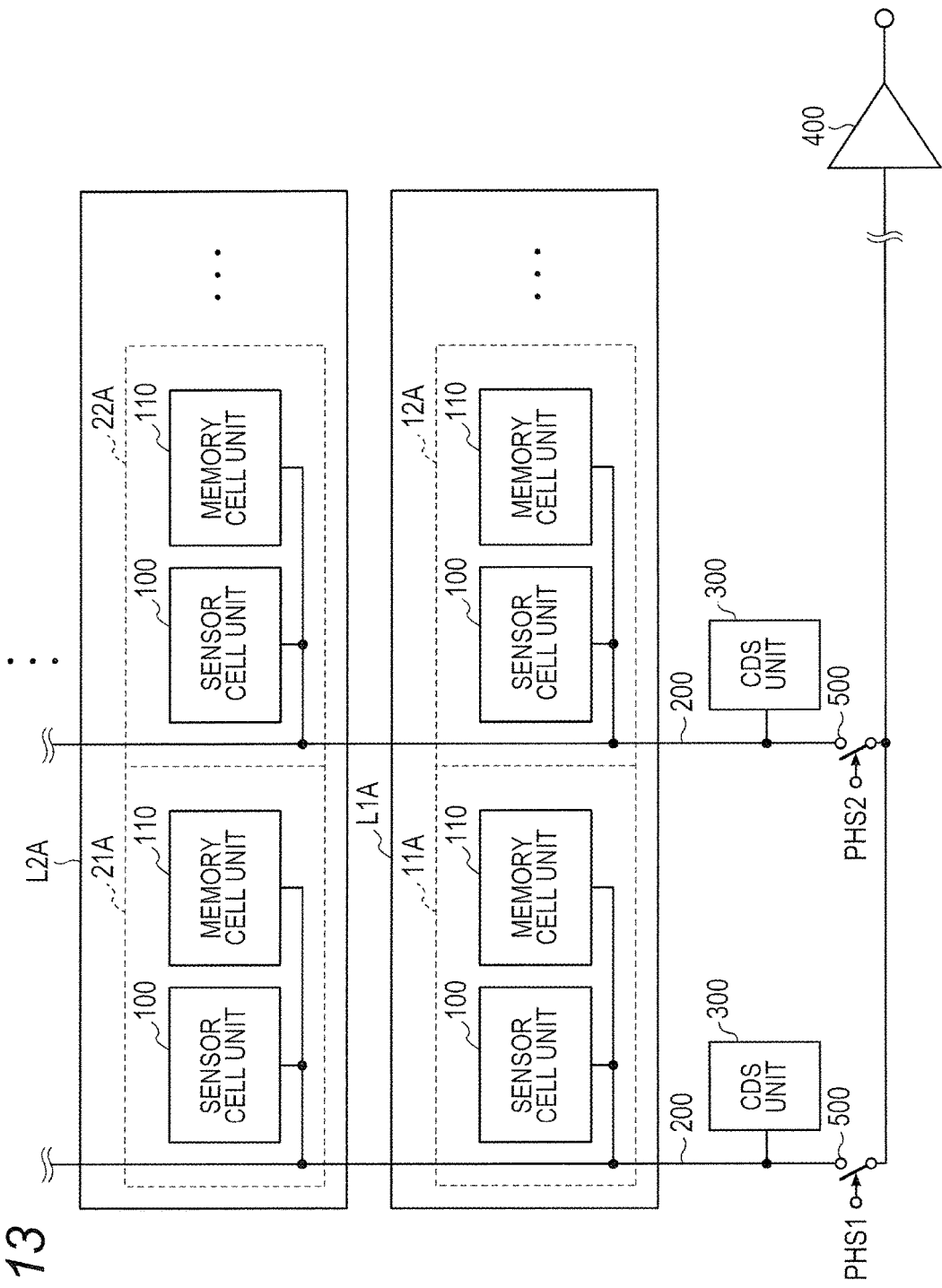
FIG. 13 is a block diagram of a line sensor unit according to a third embodiment of the present invention.

FIG. 13 is a block diagram for illustrating in detail the line sensor units L1A, L2A . . . according to the third embodiment of the present invention. The photoelectric conversion apparatus of this embodiment has N rows by two columns of line sensor units arranged so that the line sensor units L1A, L2A . . . LNA form one column while line sensor units L1B, L2B . . . LNB form the other column as FIG. 1. The line sensor unit L1A has M columns of unit pixels, 11A, 12A . . . 1MA, and the line sensor unit L2A has M columns of unit pixels, 21A, 22A . . . 2MA. The rest of the line sensor units each have M columns of similarly denoted unit pixels.

Each unit pixel includes the sensor cell unit 100 and the memory cell unit 110. The sensor cell unit 100 and the memory cell unit 110 are electrically connected to the CDS unit 300, which is provided for each column of unit pixels, via the vertical output line 200, which is provided for each column. The vertical output line 200 of each column is electrically connected to the shared buffer amplifier 400 via the scanning switch 500. The line sensor units L1B, L2B . . . have the configuration of FIG. 13 as well.

Figure 14:
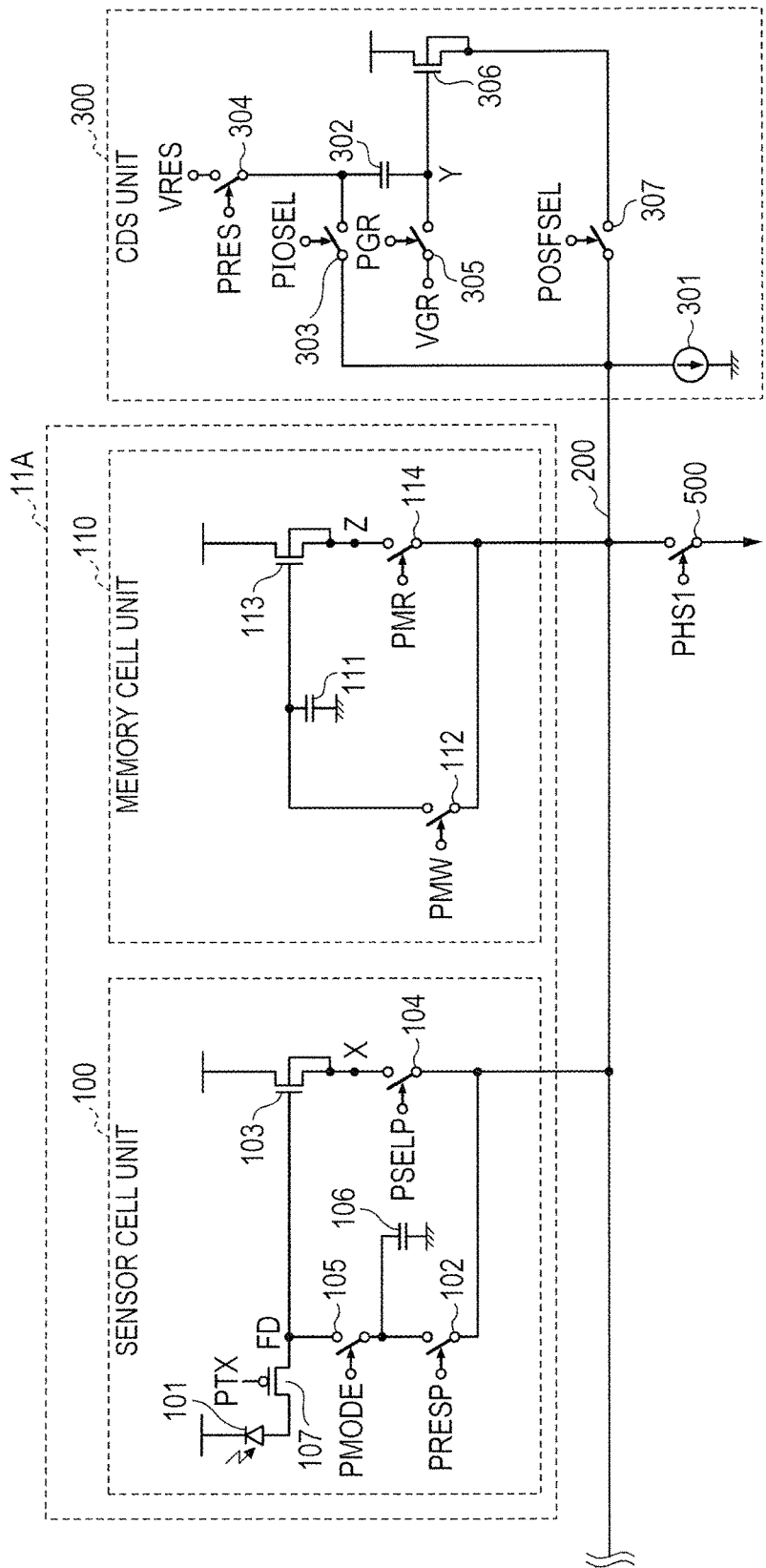
FIG. 14 is a circuit diagram of a unit pixel and a CDS unit according to the third embodiment of the present invention.

FIG. 14 is a circuit diagram for illustrating in more detail the configurations of the unit pixel 11A and the CDS unit 300 that are extracted from the configuration of FIG. 13. The configuration of the sensor cell unit 100 in this embodiment is a combination of the configuration of the fourth modification example of the first embodiment which has the sensitivity switching function and the configuration of the second embodiment which includes a transfer-type pixel. The configuration of the CDS unit 300 in this embodiment is the same as in the first embodiment and the second embodiment.

The memory cell unit 110 includes a memory capacitance element 111, a switch 112 (a first memory switch), a transistor 113 (a memory amplification unit), and a switch 114 (a second memory switch). The switches 112 and 114 are controlled with control signals PMW and PMR, respectively, to a conductive state and a non-conductive state. The transistor 113 is an NMOS transistor and has a self-bias configuration in which a substrate node and a source node are electrically connected to each other. A node at a connection point where the substrate node and the source node of the transistor 113 are connected to each other is hereinafter referred to as "node Z".

One terminal of the memory capacitance element 111 is electrically connected to one terminal of the switch 112 and a gate of the transistor 113. The other terminal of the memory capacitance element 111 is grounded. A drain of the transistor 113 is electrically connected to the power supply voltage node. The node Z, which is the source of the transistor 113, is electrically connected to one terminal of the switch 114. The other terminal of the switch 112 and the other terminal of the switch 114 are electrically connected to the vertical output line 200.

Figure 15:
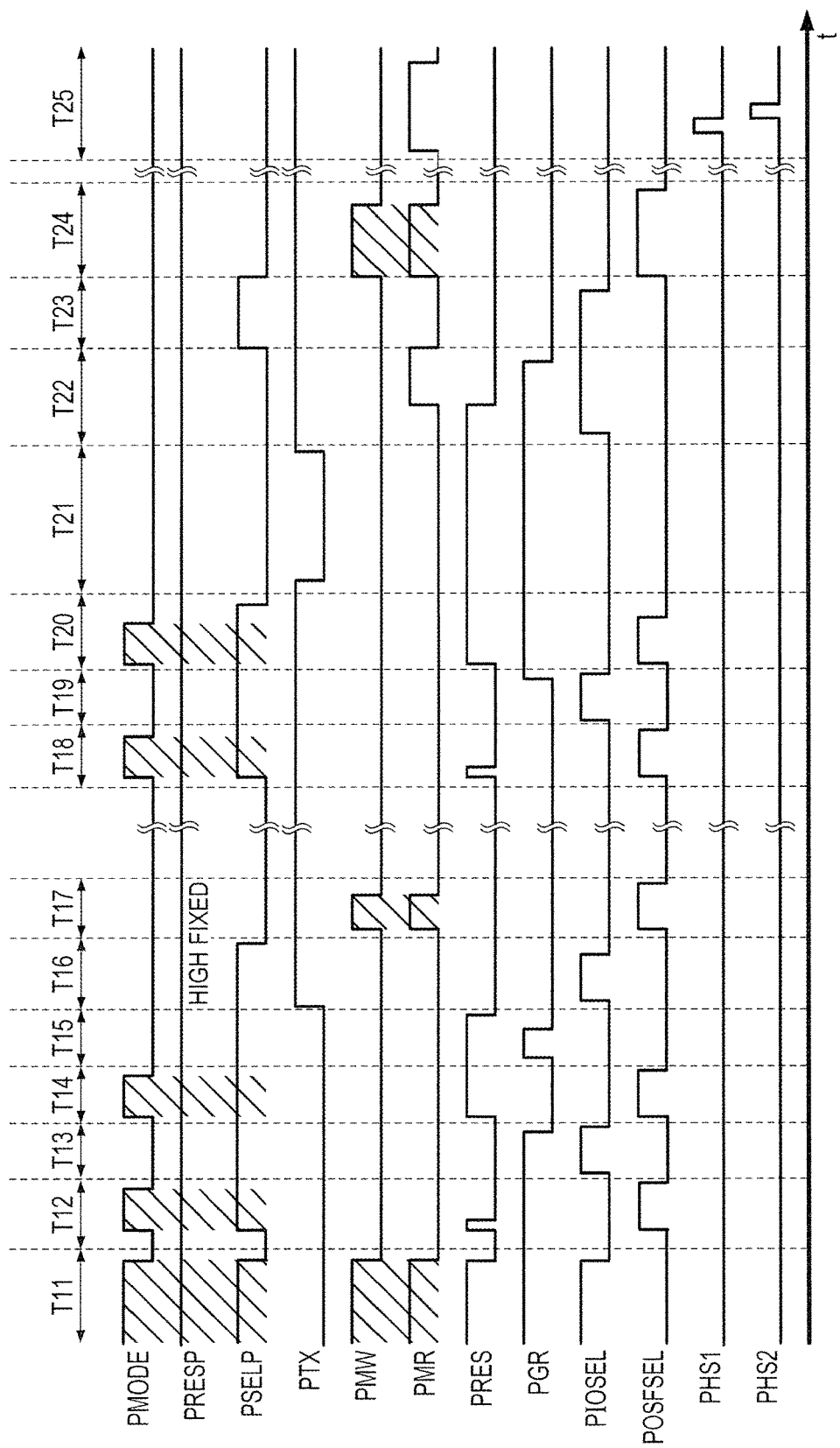
FIG. 15 is a timing chart according to the third embodiment of the present invention.

FIG. 15 is a timing chart for illustrating the operation timing of the circuit of FIG. 14. The control signal PRESP in FIG. 15 is fixed to the high level, and operation that corresponds to the high sensitivity mode illustrated in FIG. 10 is executed. The control signal PTX in FIG. 15 changes the same way as in FIG. 12. The description given below on operation timing in this embodiment is focused mainly on the operation of memory cell unit 110.

In a period T11, the sensor cell unit 100, the memory cell unit 110, and the CDS unit 300 are initialized. Each node in the memory cell unit 110 is reset with the reset voltage VRES by setting the control signals PMW and PMR both to the high level, as in the sensor cell unit 100.

In subsequent periods T12, T13, and T14, CDS processing is executed for the sensor cell unit 100 as in the first embodiment and the second embodiment. In these periods, the control signals PMW and PMR are at the low level, and the state of the memory cell unit 110 therefore does not change.

In a part of a period T15 where the control signals PRES and PGR are both at the high level, the voltage of the clamp capacitance element 302 in the CDS unit 300 is reset to (VRES−VGR) with the use of the clamp voltage VGR and the reset voltage VRES.

In a part of a period T16 where the control signals PSELP, PTX, and PIOSEL are all at the high level, the potential of the node FD is (VRES+VTHN), and the potential of the node X which is an output of the source follower inside the sensor cell unit 100 is accordingly VRES. The potential VRES is therefore input to the one terminal of the clamp capacitance element 302 via the switch 303. The clamp capacitance element 302 has been reset to the voltage (VRES−VGR) in the period T15, and the potential of the node Y in the CDS unit 300 is therefore VGR in conformity to the law of preservation of charge. The switching noise of the transfer transistor 107 and other similar noises are ignored as described in the first embodiment.

In a period T17, the control signals PMW, PMR, and POSFSEL are set to the high level, to thereby hold the potential (VGR−VTHN) in the memory capacitance element 111 and set the node Z to the potential (VGR−VTHN) as well.

In periods T18, T19, T20, and T21, which arrive after a predetermined length of accumulation time elapses, operation is executed that is similar to the FD resetting operation and the charge transfer operation in the periods T6, T7, T8, and T0 described in the second embodiment with reference to FIG. 12. In these periods, the control signals PMW and PMR are at the low level, and the state of the memory cell unit 110 therefore does not change. The voltage amplitude of an optical signal generated in the sensor cell unit 100 is VL as described in the first embodiment and the second embodiment.

In a period T22, the control signal PMR shifts to the high level, and the voltage (VGR−2×VTHN), which is based on the voltage (VGR−VTHN) held in the memory capacitance element 111, is output to the vertical output line 200. The potential of the node Z changes by (−VTHN) at this point from its initial value (VGR−VTHN), which has been written in the period T17. Consequently, noise similar to the noise caused by the capacitive coupling that is due to the parasitic capacitance Cp generated in the sensor cell unit 100 is therefore superimposed on an output signal from the memory cell unit 110 as well. When this noise voltage is given as (−VNM1), a voltage (VGR−2×VTHN−VNM1) is output to the vertical output line 200. The control signal PIOSEL also shifts to the high level in the period T22, and the voltage (VGR−2×VTHN−VNM1) of the vertical output line 200 is therefore held in the clamp capacitance element 302 via the switch 303, with the clamp voltage VGR as a reference.

In a period T23, the control signal PSELP shifts to the high level, and an output voltage (VL+VRES) from the sensor cell unit 100 is applied to the clamp capacitance element 302. This gives the node Y a potential (VL+VRES+2×VTHN+VNM1) in conformity to the law of preservation of charge.

In a period T24, the control signals PMW, PMR, and POSFSEL shift to the high level, and a voltage level (VL+VRES+VTHN+VNM1) based on the optical signal is again held in the memory capacitance element 111. The potential of the node Z at this point is also (VL+VRES+VTHN+VNM1).

In a period T25, the control signal PMR shifts to the high level, and signals based on the amount of light are sequentially output to the outside of the sensor from the respective memory cell units 110. Immediately after the shift of the control signal PMR to the high level, the potential of the node Z changes to (VL+VRES+VNM1), which is lower than the potential given in the period T24 by the voltage (−VTHN). A signal superimposed with noise (−VNM2), which is due to the parasitic capacitance between the gate and the source of the transistor 113, is therefore output. The output voltage from the buffer amplifier 400 is accordingly (VL+VRES+VNM1−VNM2). Under an ideal condition where VNM1 and VNM2 are equal to each other as described in the first embodiment, the output voltage from the buffer amplifier 400 is (VR+VRES). In other words, the noise due to the parasitic capacitance between the gate and the source of the transistor 113 is canceled out and a signal that is determined only by the reset voltage VRES and the voltage amplitude VL of the optical signal is output.

In the first embodiment and the second embodiment, the PD 101 is constantly exposed to light and the potential of the PD 101 keeps changing with time, unless the exposure time is controlled with the use of a light shielding member such as a mechanical shutter. A difference in exposure time between one sensor cell unit 100 and another sensor cell unit 100 can therefore be an issue in the first embodiment in some cases. In the second embodiment, the potential of the node FD may fluctuate after photocharges are transferred, depending on some parameters such as the amount of light leaking from the PD 101, the capacitance value of the node FD, the leakage current amount, and the length of time from the completion of transfer to the read starting operation.

The same effects as those in the first embodiment and the second embodiment can be obtained in this embodiment. In addition, the influence of the problems described above is reduced or eliminated in this embodiment, where the memory cell unit 110 is provided in each unit pixel.

While the sensor cell units 100 and the memory cell units 110 are provided in the same number in the photoelectric conversion apparatus of this embodiment, the relationship between the number of the sensor cell units 100 and the number of the memory cell units 110 is not limited thereto. For example, the photoelectric conversion apparatus may include more memory cell units 110 than the sensor cell units 100. This way, the element count of the CDS unit 300 can be reduced by sharing the CDS unit 300 among a plurality of line sensor units. When this photoelectric conversion apparatus is used as an AF sensor, the precision of focus detection can be improved by, for example, arranging the PDs 101 at narrow intervals and thus increasing the density of focusing points.

(Fourth embodiment)

Figure 16:
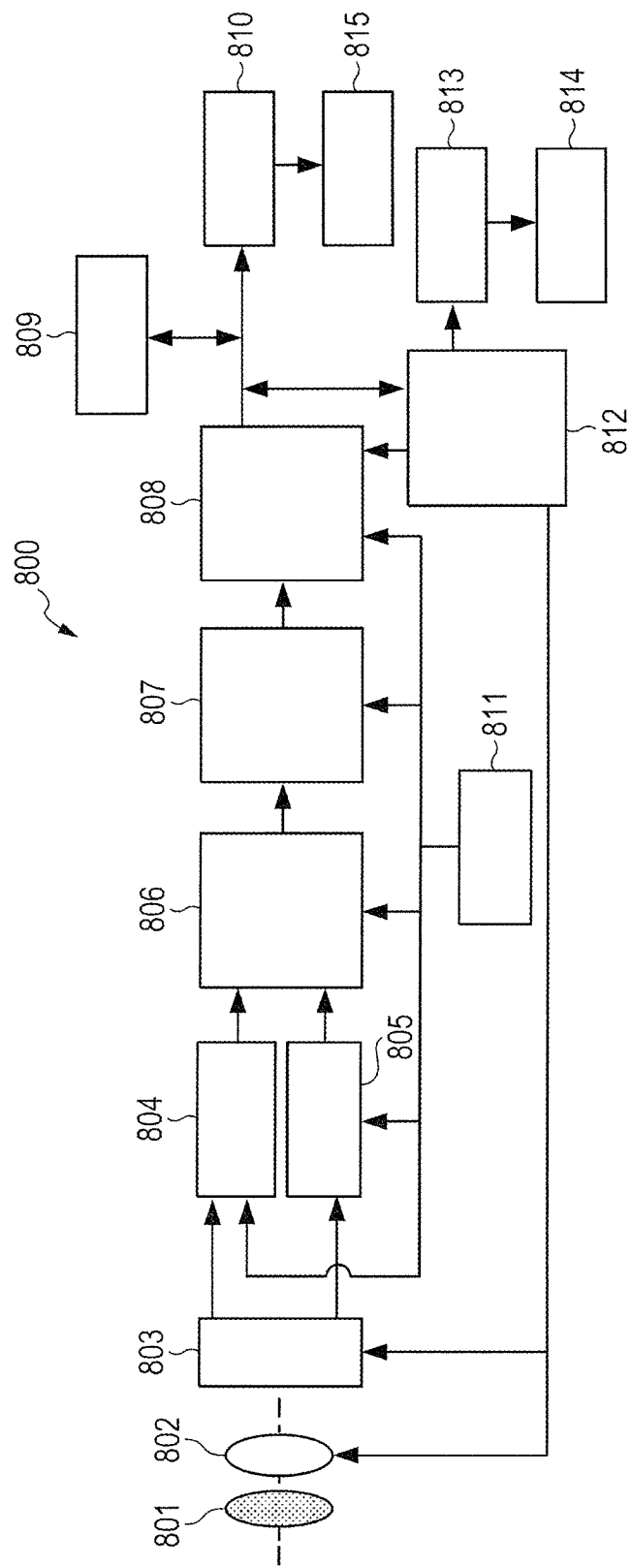
FIG. 16 is a block diagram of an imaging system according to a fourth embodiment of the present invention.

FIG. 16 is a block diagram for illustrating a configuration example of an imaging system according to a fourth embodiment of the present invention. First, a structure of the imaging system according to this embodiment is described with reference to FIG. 16.

As illustrated in FIG. 16, an imaging system 800 according to this embodiment includes a barrier 801, a lens 802, a diaphragm 803, a solid-state imaging apparatus 804, and an auto-focusing (AF) sensor 805 (focus detection sensor). The lens 802 is an optical system configured to form an optical image of an object. The barrier 801 is configured to protect the lens 802. The diaphragm 803 is configured to adjust an amount of light that passes through the lens 802. The solid-state imaging apparatus 804 is configured to obtain the optical image of the object, which is formed by the lens, as image signals, and functions as an imaging unit of this imaging system. The AF sensor 805 is the focus position detection apparatus using the photoelectric conversion apparatus described in each of the above-mentioned embodiments, and functions as a focus detection unit of the imaging system 800 according to this embodiment.

The imaging system 800 further includes an analog signal processing apparatus 806, an analog-to-digital (A/D) converter 807, and a digital signal processing unit 808. The analog signal processing apparatus 806 is configured to process signals output from the solid-state imaging apparatus 804 and the AF sensor 805. The A/D converter 807 is configured to subject the signals output from the analog signal processing apparatus 806 to analog-to-digital conversion. The digital signal processing unit 808 is configured to perform various corrections on the image data output from the A/D converter 807 or to compress the data. The analog signal processing apparatus 806, the A/D converter 807, and the digital signal processing unit 808 function as an image signal processing unit. In the case where the solid-state imaging apparatus 804 includes an A/D converter, an image signal output from the solid-state imaging apparatus 804 is in the form of a digital signal. The digital signal processing unit 808 functions as an image signal processing unit in this case. The image signal processing unit generates an image of an object with the use of the image signal output by the solid-state imaging apparatus 804.

The imaging system 800 further includes a memory unit 809, an external interface (I/F) circuit 810, a timing generation unit 811, a general control unit 812, and a recording-medium control I/F unit 813. The memory unit 809 is configured to temporarily store the image data. The external I/F circuit 810 is configured to communicate to/from an external device such as an external computer 815. The timing generation unit 811 is configured to output various timing signals to the digital signal processing unit 808 and the like. The general control unit 812 is configured to control various operations and the entire camera. The recording-medium control I/F unit 813 is configured to exchange data with a removable recording medium 814 such as a semiconductor memory, which is configured to record the acquired image data or read out the image data.

Next, photographing operation of the imaging system 800 according to this embodiment is described. When the barrier 801 is opened, the optical image from the object enters the AF sensor 805 via the lens 802 and the diaphragm 803. The general control unit 812 calculates, based on an output signal from the AF sensor 805, a distance to the object by the phase difference detection method as described above. Thereafter, the general control unit 812 performs auto-focusing control in which the lens 802 is driven based on a calculation result, it is determined again whether or not the object is in focus, and when it is determined that the object is not in focus, the lens 802 is driven again.

Then, after it is confirmed that the object is in focus, an accumulation operation by the solid-state imaging apparatus 804 is started. When the accumulation operation of the solid-state imaging apparatus 804 ends, the image signals output from the solid-state imaging apparatus 804 are subjected to predetermined processing in the analog signal processing apparatus 806, and then to the analog-to-digital conversion in the A/D converter 807. The image signals that have been subjected to the analog-to-digital conversion are written into the memory unit 809 by the general control unit 812 via the digital signal processing unit 808.

Thereafter, the data accumulated in the memory unit 809 is recorded on the recording medium 814 via the recording-medium control I/F unit 813 under control of the general control unit 812. Alternatively, the data accumulated in the memory unit 809 may be input directly to the external computer 815 or the like via the external I/F circuit 810.

The photoelectric conversion apparatus described in each of the above-mentioned embodiments may be used to form the AF sensor to improve the precision of auto-focusing. Therefore, according to the imaging system in this embodiment using the AF sensor, more precise focusing may be performed, and hence an image having higher definition may be obtained.

The imaging system 800 described in the fourth embodiment exemplifies an imaging system to which the photoelectric conversion apparatus in each of the embodiments of the present invention is applicable, and the imaging system to which the photoelectric conversion apparatus according to the present invention is applicable is not limited to the configuration illustrated in FIG. 16.

The embodiments described above are given as examples of carrying out the present invention, and can be modified or combined in various ways without departing from the technical concept of the present invention. For instance, two or more embodiments out of the embodiments described above can be combined with one another to suit individual cases.

For example, the conductivity type of a semiconductor used to form the MOS transistors included in the photoelectric conversion apparatus of the embodiments may be changed. In this case, the same operation as in the embodiments can be executed by inverting the high level-low level relationships of the control signals accordingly. The switches may also be other elements than MOS transistors, which are given as an example in the embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-031531, filed Apr. 13, 2015, which is hereby incorporated by reference herein in its entirety.

What is claimed is:

1. A photoelectric conversion apparatus, comprising:
    a sensor cell unit comprising a photoelectric conversion unit, an amplification unit, a select switch, and a reset switch, the amplification unit comprising an input node and an output node;
    an output line;
    a signal processing unit; and
    a control unit,
    wherein the output node is electrically connected to the signal processing unit via the select switch and via the output line in this order,
    wherein an electrical path between the output node and the output line is switched between a conductive state and a non-conductive state by the select switch,
    wherein the input node is electrically connected to the photoelectric conversion unit, and is electrically connected to the signal processing unit via the reset switch and via the output line in this order,
    wherein an electric path between the input node and the output line is switched between a conductive state and a non-conductive state by the reset switch,
    wherein the control unit is configured to control the select switch to be in a conductive state in a period in which the reset switch is in a conductive state, and wherein the sensor cell unit further comprises a switch, and a capacitance element electrically connected to the input node via the switch.

2. The photoelectric conversion apparatus according to claim 1,
wherein the photoelectric conversion apparatus comprises a plurality of the sensor cell units, and
wherein the select switch and the reset switch in each of the plurality of sensor cell units are electrically connected to the output line.

3. The photoelectric conversion apparatus according to claim 1,
wherein the photoelectric conversion unit is electrically connected to a node to which the reset switch and the input node are electrically connected, and
wherein the control unit is configured to control the reset switch to be in a conductive state, thereby electrically connecting the photoelectric conversion unit and the input node to the output line.

4. The photoelectric conversion apparatus according to claim 1,
wherein the switch comprises a transfer switch,
wherein each of an electrical path between the photoelectric conversion unit and the input node, and an electrical path between the photoelectric conversion unit and the reset switch are switched between a conductive state and a non-conductive state by the transfer switch, and
wherein the control unit is configured to control the transfer switch to be in a conductive state in a predetermined period in which the reset switch and the select switch are both in the conductive state.

5. The photoelectric conversion apparatus according to claim 3,
wherein the control unit is configured to control the reset switch to be in a non-conductive state and the select switch to be in a conductive state in a second period, which follows a predetermined period in which the reset switch and the select switch are both in the conductive state,
wherein the signal processing unit is configured to hold a first voltage, which is a voltage that the output line has in the second period,
wherein the signal processing unit is configured to output a voltage based on the first voltage to the output line in a third period, which follows the second period, and
wherein, in the third period, the control unit is configured to control the reset switch and the select switch to be both in a conductive state, and the voltage that is based on the first voltage and that is output to the output line is output to the photoelectric conversion unit and to the input node.

6. The photoelectric conversion apparatus according to claim 1, wherein the signal processing unit comprises:
a memory capacitance element configured to hold a voltage input to the memory capacitance element;
a memory amplification unit to which the voltage held in the memory capacitance element is input;
a first memory switch configured to control a conductive state and a non-conductive state of an electrical path between an output node of the memory amplification unit and the output line; and
a second memory switch configured to control a conductive state and a non-conductive state of an electrical path between the memory capacitance element and the output line.

7. The photoelectric conversion apparatus according to claim 6, wherein the control unit is configured to control the first memory switch and the second memory switch so that the first memory switch and the second memory switch are both in a conductive state.

8. The photoelectric conversion apparatus according to claim 1, further comprising:
a current source load configured to supply a current to the amplification unit and the signal processing unit; and
a switch connected in an electrical path between the current source load and the output line.

9. The photoelectric conversion apparatus according to claim 1, wherein the reset switch and the select switch are controlled so that the select switch is in a conductive state in a period that is a part of a period in which the reset switch is in a conductive state.

10. An imaging system, comprising:
a focus detection sensor comprising the photoelectric conversion apparatus according to claim 1;
a solid-state imaging apparatus configured to output an image signal by photographing an object; and
an image signal processing unit configured to generate an image of the object by using the image signal.

11. The photoelectric conversion apparatus according to claim 7, wherein the first memory switch and the second memory switch are both in the conductive state in the period in which the reset switch is in the conductive state.

* * * * *